US010277856B2

(12) United States Patent
Okura et al.

(10) Patent No.: US 10,277,856 B2
(45) Date of Patent: Apr. 30, 2019

(54) SOLID-STATE IMAGING DEVICE, METHOD FOR DRIVING SOLID-STATE IMAGING DEVICE, AND ELECTRONIC APPARATUS

(71) Applicant: Brillnics Inc., Grand Cayman (KY)

(72) Inventors: Shunsuke Okura, Tokyo (JP); Toshinori Otaka, Tokyo (JP); Junichi Nakamura, Tokyo (JP)

(73) Assignee: BRILLNICS INC., Grand Cayman (KY)

( * ) Notice: Subject to any disclaimer, the term of this patent is extended or adjusted under 35 U.S.C. 154(b) by 0 days.

(21) Appl. No.: 15/718,265

(22) Filed: Sep. 28, 2017

(65) Prior Publication Data

US 2018/0091754 A1    Mar. 29, 2018

(30) Foreign Application Priority Data

Sep. 29, 2016  (JP) ................................. 2016-192237
Sep. 12, 2017  (JP) ................................. 2017-175028

(51) Int. Cl.
*H04N 5/378* (2011.01)
*H04N 5/3745* (2011.01)
*H04N 5/376* (2011.01)
*H01L 27/146* (2006.01)
*H04N 5/353* (2011.01)

(52) U.S. Cl.
CPC ....... *H04N 5/378* (2013.01); *H01L 27/14643* (2013.01); *H04N 5/3532* (2013.01); *H04N 5/3745* (2013.01); *H04N 5/3765* (2013.01); *H04N 5/353* (2013.01)

(58) Field of Classification Search
None
See application file for complete search history.

(56) References Cited

U.S. PATENT DOCUMENTS

| | | | |
|---|---|---|---|
| 9,807,330 B2* | 10/2017 | Aoki | H04N 5/3745 |
| 2006/0274176 A1* | 12/2006 | Guidash | H01L 27/14643 |
| | | | 348/300 |
| 2016/0049432 A1* | 2/2016 | Otaka | H01L 27/14614 |
| | | | 348/308 |

OTHER PUBLICATIONS

J. Aoki, et al., "A Rolling-Shutter Distortion-Free 3D Stacked Image Sensor with −160dB Parasitic Light Sensitivity In-Pixel Storage Node" ISSCC 2013/Session 27/Image Sensors/27.3. (3pages).

* cited by examiner

*Primary Examiner* — James M Hannett
(74) *Attorney, Agent, or Firm* — Westerman, Hattori, Daniels & Adrian, LLP

(57) ABSTRACT

A pixel portion includes a first pixel array in which a plurality of photoelectric conversion reading parts of first pixels are arranged in a matrix, a holding part array in which a plurality of signal holding parts of first pixels are arranged in a matrix, and a second pixel array in which a plurality of photoelectric conversion reading parts of second pixels are arranged in a matrix, wherein, at the time of a rolling shutter mode, readout signals of the photoelectric conversion reading parts of the first pixels and the second pixels are immediately output to a first vertical signal line without following a bypass route and, at the time of a global shutter mode, held signals of the signal holding parts of the first pixels are output to a second vertical signal line. Due to this, a solid-state imaging device can prevent complication of the configuration.

18 Claims, 13 Drawing Sheets

SOLID-STATE IMAGING DEVICE, METHOD FOR DRIVING SOLID-STATE IMAGING DEVICE, AND ELECTRONIC APPARATUS

CROSS-REFERENCE TO RELATED APPLICATION

The present invention contains subject matter related to Japanese Patent Application No. 2016-192237 filed in the Japan Patent Office on Sep. 29, 2016, the entire contents of which being incorporated herein by reference.

TECHNICAL FIELD

The present invention relates to a solid-state imaging device, a method for driving the solid-state imaging device, and an electronic apparatus.

BACKGROUND ART

As solid-state imaging devices (image sensors) using photoelectric conversion elements which detect light to generate electric charges, CMOS (complementary metal oxide semiconductor) image sensors have been put into practical use. CMOS image sensors are being widely applied as parts of digital cameras, video cameras, monitoring cameras, medical endoscopes, personal computers (PC), mobile phones, and other portable terminal devices (mobile devices) and various other types of electronic apparatuses.

A CMOS image sensor has a floating diffusion (FD) amplifier having, for each pixel, a photodiode (photoelectric conversion element) and floating diffusion layer. For readout, the mainstream type is the column parallel output type that performs selects a certain row in a pixel array and simultaneously reads the pixels out to a column output direction.

In this regard, in a CMOS image sensor, photo charges which are generated and accumulated (stored or integrated) in the photodiodes are sequentially scanned and read out for each of the pixels or each of the rows. When performing this sequential scanning, that is when employing a rolling shutter as an electronic shutter, the start times and end times of exposure for accumulating photo charges cannot be made to match in all of the pixels. For this reason, in the case of sequential scanning, there is the problem of occurrence of distortion in a captured image when capturing an image of a moving subject.

Therefore, in capturing an image of a subject moving at a high speed or in sensing applications requiring simultaneity of the captured image, where image distortion is not allowed, as the electronic shutter, a global shutter which starts the exposure and ends the exposure at the same timing for all pixels in the pixel array portion is employed.

In a CMOS image sensor employing a global shutter as the electronic shutter, a pixel is, for example, provided is made of a signal holding part which holds a signal read out from a photoelectric conversion reading part in a signal holding capacitor. In a CMOS image sensor employing a global shutter, simultaneity of an entire image is secured by accumulating the charges of the photodiodes as voltage signals all together in the signal holding capacitors in the signal holding parts and later sequentially reading them out (see for example NPLT 1). Further, this CMOS image sensor has bypass switches for bypassing the signal holding parts and transferring the outputs of the photoelectric conversion reading parts to signal lines and therefore is configured so as to have a rolling shutter function together in addition to a global shutter function.

The stacked type CMOS image sensor disclosed in NPLT 1 has a stacked structure of a first substrate (pixel die) and a second substrate (ASIC die) connected through microbumps (connecting parts). Further, the photoelectric conversion reading parts of the pixels are formed on the first substrate, while the signal holding parts of the pixels, signal lines, vertical scanning circuit, horizontal scanning circuit, column readout circuit, and so on are formed on the second substrate.

CITATION LIST

Non-Patent Literature

NPLT 1: J. Aoki, et al., "A Rolling-Shutter Distortion-Free 3D Stacked Image Sensor with −160 dB Parasitic Light Sensitivity In-Pixel Storage Node" ISSCC 2013/SESSION 27/Image SENSORS/27.3.

SUMMARY OF INVENTION

Technical Problem

The conventional CMOS image sensor provided with a global shutter function explained above shares signal lines for the two functions of the global shutter function and rolling shutter function, therefore must be provided, parallel to the signal holding parts, with bypass switches which bypass the signal holding parts and transfer signals to the signal lines, so has the following disadvantages. The conventional stacked type CMOS image sensor provided with the global shutter function explained above is provided with pairs of pixels and signal holding capacitors for global shutter use on the first substrate (pixel die) and second substrate (ASIC die), therefore has the problem that the area required for peripheral circuits on the second substrate (ASIC die) side becomes overhead, so the area efficiency is low. Further, in the CMOS image sensor explained above, the configuration on the signal holding part side becomes complex.

An object of the present invention is to provide a solid-state imaging device, a method for driving the solid-state imaging device, and an electronic apparatus capable of preventing complication of the configuration while preventing a drop in the area efficiency in layout.

Solution to Problem

A solid-state imaging device of a first aspect of the present invention comprises a pixel portion which are arranged at least first pixels including photoelectric conversion reading parts and signal holding parts and second pixels including photoelectric conversion reading parts, a readout portion for reading pixel signals from the pixel portion, a first signal line to which readout signals of the photoelectric conversion reading parts are output, and a second signal line to which held signals of the signal holding parts are output, wherein a photoelectric conversion reading part of at least the first pixels includes an output node, a photoelectric conversion element which accumulates a charge generated by photoelectric conversion in an accumulation period, a transfer element capable of transferring the charges accumulated in the photoelectric conversion element in a transfer period, a floating diffusion to which the charge accumulated in the photoelectric conversion element is transferred through the transfer element, a source follower element which converts the charge of the floating diffusion to a voltage signal corresponding to the charge amount and outputs the converted signal to the output node, a reset element which resets the floating diffusion to a predetermined potential in a reset period, and a selection element which electrically connects the output node with the first signal line in a first period, and the signal holding part includes a signal holding capacitor capable of holding a signal output from the output node of the photoelectric conversion reading part of the first pixels, a switch element which selectively connects the signal holding capacitor with the output node of the photoelectric conversion reading part in a second period, and an output part including a source follower element which outputs a signal held in the signal holding capacitor in accordance with a held voltage in the second period and selectively outputting the converted signal to the second signal line.

A second aspect of the present invention is a method for driving a solid-state imaging device having a pixel portion which are arranged first pixels including photoelectric conversion reading parts and signal holding parts and second pixels including photoelectric conversion reading parts, a readout portion for reading pixel signals from the pixel portion, a first signal line to which readout signals of the photoelectric conversion reading parts are output, and a second signal line to which held signals of the signal holding parts are output, wherein a photoelectric conversion reading part of at least the first pixels includes an output node, a photoelectric conversion element which accumulates a charge generated by photoelectric conversion in an accumulation period, a transfer element capable of transferring the charges accumulated in the photoelectric conversion element in a transfer period, a floating diffusion to which the charge accumulated in the photoelectric conversion element is transferred through the transfer element, a source follower element which converts the charge of the floating diffusion to a voltage signal corresponding to the charge amount and outputs the converted signal to the output node, a reset element which resets the floating diffusion to the predetermined potential in a reset period, and a selection element which electrically connects the output node with the first signal line in a first period, the signal holding part includes a signal holding capacitor capable of holding a signal output from the output node of the photoelectric conversion reading part in a second period, and an output part including a source follower element which outputs a signal held in the signal holding capacitor in accordance with a held voltage in the second period and selectively outputting the converted signal to the second signal line, and the pixel portion includes a first pixel array in which the plurality of photoelectric conversion reading parts of the first pixels are arranged in a matrix, a holding part array in which the plurality of signal holding parts of the first pixels are arranged in a matrix, and a second pixel array in which the plurality of photoelectric conversion reading parts of the second pixels are arranged in a matrix, the method for driving a solid-state imaging device comprising making the first pixel array of the first pixels and the second pixel array of the second pixels active and reading the pixel signals at the time of a first operation and rendering the selection elements in the photoelectric conversion reading parts in the first pixels and in the second pixels non-selection states, then making the first pixel array of the first pixels and the holding part array active and reading the pixel signals at the time of a second operation.

An electronic apparatus of a third aspect of the present invention has a solid-state imaging device and an optical system forming a subject image in the solid-state imaging device, wherein the solid-state imaging device has a pixel portion which are arranged at least first pixels including photoelectric conversion reading parts and signal holding parts and second pixels including photoelectric conversion reading parts, a readout portion for reading pixel signals from the pixel portion, a first signal line to which readout signals of the photoelectric conversion reading parts are output, and a second signal line to which held signals of the signal holding parts are output, a photoelectric conversion reading part of at least the first pixels includes an output node, a photoelectric conversion element which accumulates a charge generated by photoelectric conversion in an accumulation period, a transfer element capable of transferring the charges accumulated in the photoelectric conversion element in a transfer period, a floating diffusion to which the charge accumulated in the photoelectric conversion element is transferred through the transfer element, a source follower element which converts the charge of the floating diffusion to a voltage signal corresponding to the charge amount and outputs the converted signal to the output node, a reset element which resets the floating diffusion to the predetermined potential in a reset period, and a selection element which electrically connects the output node with the first signal line in a first period, and the signal holding part includes a signal holding capacitor capable of holding a signal output from the output node of the photoelectric conversion reading part of the first pixels, a switch element which selectively connects the signal holding capacitor with the output node of the photoelectric conversion reading part in a second period, and an output part including a source follower element which outputs a signal held in the signal holding capacitor in accordance with a held voltage in the second period and selectively outputting the converted signal to the second signal line.

Advantageous Effects of Invention

According to the present invention, complication of the configuration is prevented while a drop in the area efficiency in layout can be prevented.

DESCRIPTION OF EMBODIMENTS

Below, embodiments of the present invention will be explained with reference to the drawings.

First Embodiment

Figure 1:
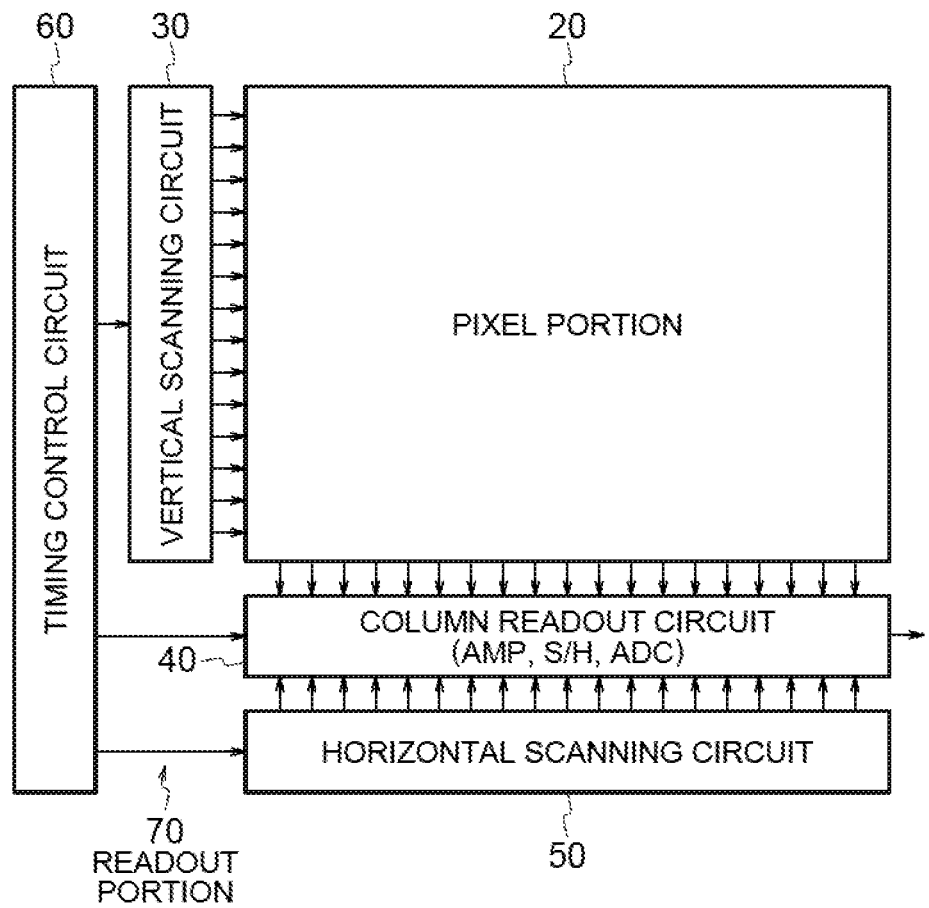
FIG. 1 is a block diagram showing an example of the configuration of a solid-state imaging device according to a first embodiment of the present invention.

FIG. 1 is a block diagram showing an example of the configuration of a solid-state imaging device according to a first embodiment of the present invention. In the present embodiment, a solid-state imaging device 10 is for example configured by a CMOS image sensor.

This solid-state imaging device 10, as shown in FIG. 1, has a pixel portion 20 as an imaging part, a vertical scanning circuit (row scanning circuit) 30, readout circuit (column readout circuit) 40, horizontal scanning circuit (column scanning circuit) 50, and timing control circuit 60 as principal components. Among these components, for example, the vertical scanning circuit 30, column readout circuit 40, horizontal scanning circuit 50, and timing control circuit 60 configure a readout portion 70 of pixel signals.

In the first embodiment, the solid-state imaging device 10, as will be explained in detail later, is configured as for example a stacked type CMOS image sensor having a pixel portion 20 in which pixels comprised of first pixels each including a photoelectric conversion reading part and signal holding part and second pixels each including a photoelectric conversion reading part are mixed and having both the two operation functions of a first operation of a rolling shutter and a second operation of a global shutter. In the solid-state imaging device 10 according to the first embodiment, the pixel portion 20 includes a first pixel array in which the plurality of photoelectric conversion reading parts of the first pixels are arranged in a matrix, a holding part array in which the plurality of signal holding parts of the first pixels are arranged in a matrix, and a second pixel array in which the plurality of photoelectric conversion reading parts of the second pixels are arranged in a matrix. Further, at the time of the first operation of the rolling shutter mode, read-out signals of the photoelectric conversion reading parts of the first pixels and second pixels are directly output to a first vertical signal line without following a bypass route. Further, at the time of the second operation of the global shutter mode, the held signals of the signal holding parts of the first pixels are output to a second vertical signal line.

Below, outlines of the configurations and functions of the parts of the solid-state imaging device 10, particularly, the configuration and function of the pixel portion 20, readout processing related to them, the stacked structures of the pixel portion 20 and readout portion 70, and so on, will be explained in detail.

Configurations of First Pixels and Second Pixels and Pixel Portion 20

Figure 2:
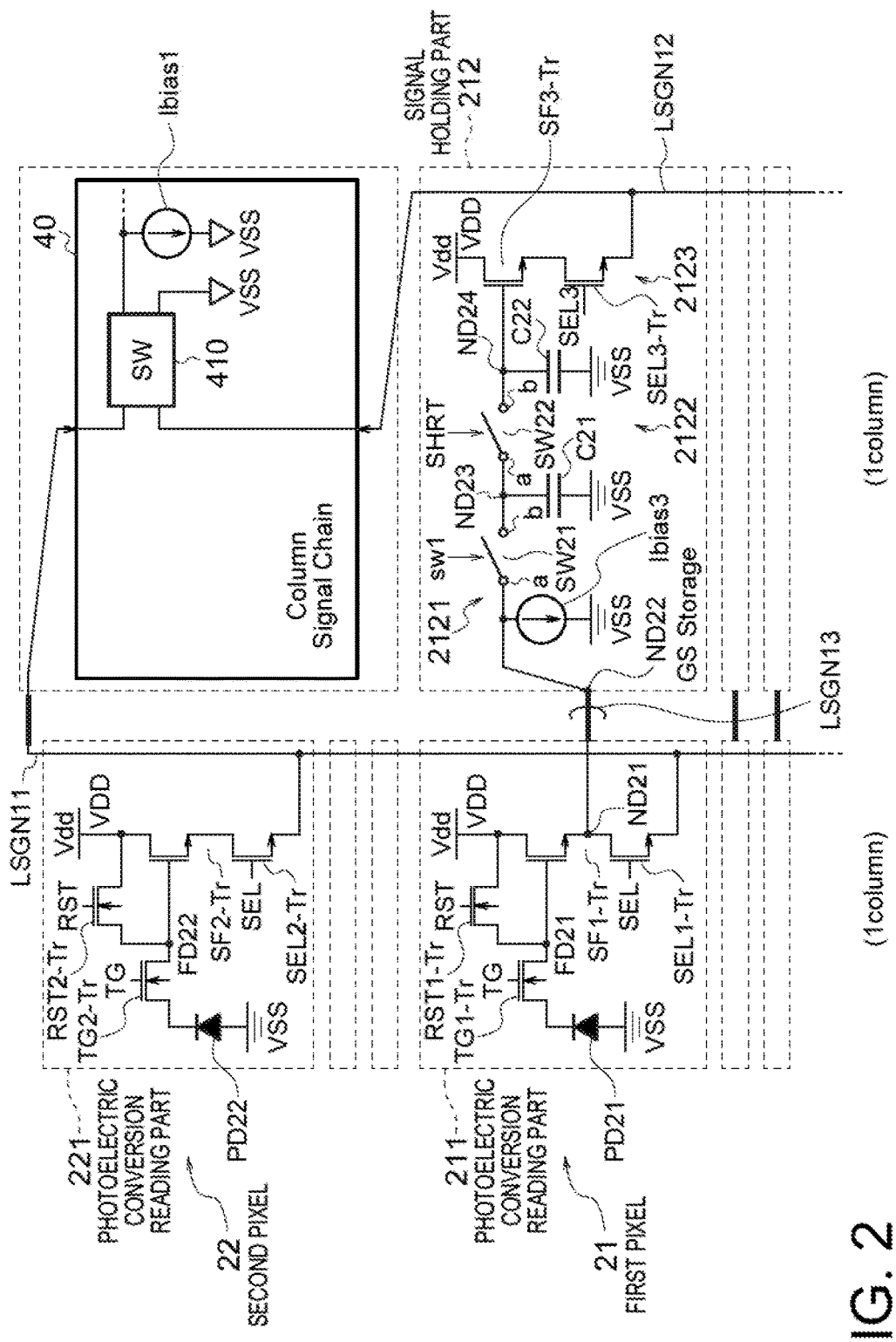
FIG. 2 is a circuit diagram showing an example of a first pixel and second pixel of the solid-state imaging device according to the first embodiment of the present invention.

FIG. 2 is a circuit diagram showing an example of a first pixel and a second pixel of the solid-state imaging device 10 according to the first embodiment of the present invention.

A first pixel 21 arranged in the pixel portion 20 includes a photoelectric conversion reading part 211 and a signal holding part 212. A second pixel 22 arranged in the pixel portion 20 includes a photoelectric conversion reading part 221.

The photoelectric conversion reading part 211 of the first pixel 21 includes a photodiode (photoelectric conversion element) and pixel amplifier. Specifically, this photoelectric conversion reading part 211 has for example a photoelectric conversion element comprised of a photodiode PD21. This photodiode PD21 is provided with a transfer element comprised of a transfer transistor TG1-Tr, a reset element comprised of a reset transistor RST1-Tr, a source follower element comprised of a source follower transistor SF1-Tr, an output node ND21, and a selection element (selection switch) comprised of a selection transistor SEL1-Tr. In this way, the photoelectric conversion reading part 211 of the first pixel 21 according to the first embodiment includes four transistors (4Tr) of the transfer transistor TG1-Tr, reset transistor RST1-Tr, source follower transistor SF1-Tr, and selection transistor SEL1-Tr.

In the photoelectric conversion reading part 211 according to the first embodiment, the output node ND21 is connected to the input part of the signal holding part 212 of the first pixel 21 and is connected through the selection transistor SEL1-Tr to the first vertical signal line LSGN11. The photoelectrio conversion reading part 211 outputs the read-out voltage (signal voltage) (VRBT1, VSIG1) to the first vertical signal line LSGN11 at the time of the rolling shutter mode. The photoelectric conversion reading part 211 outputs the read-out voltage (signal voltage) (VRST1, VSIG1) to the signal holding part 212 at the time of the global shutter mode.

In the first embodiment, the first vertical signal line LSGN11 is driven by a constant current source Ibias1 at the time of the rolling shutter mode while the second vertical signal line LSGN12 is driven by the constant current source Ibias1 at the time of the global shutter mode. The constant current source Ibias1 is shared at the time of the rolling shutter mode and the time of the global shutter mode. The constant current source Ibias1, as shown in FIG. 2, is switched to which it is connected in accordance with the operation mode by a switch part 410. At the time of the rolling shutter mode, the first vertical signal line LSGN11 is connected to the constant current source Ibias1 while the second vertical signal line LSGN12 is connected to a reference potential VSS (for example, the ground). On the other hand, at the time of the global shutter mode, the second vertical signal line LGN12 is connected to the constant current source Ibias1 while the first vertical signal line LSGN11 is connected to the reference potential VSS (for example, the ground).

The photodiode PD21 generates and accumulates (stores) an amount of signal charge (here, electrons) corresponding to an incident light quantity. Below, a case where a signal charge is electrons and each transistor is an n-type transistor will be explained, however, the signal charge may be a hole or each transistor may be a p-type transistor. Further, the present embodiment is effective also in a case where each transistor is shared among a plurality of photodiodes and transfer transistors.

The transfer transistor TG1-Tr in the photoelectric conversion reading part 211 is connected between the photodiode PD21 and the floating diffusion FD21 and is controlled by a control signal TG applied to the gate through a control line. The transfer transistor TG1-Tr is selected and becomes conductive in a transfer period where the control signal TG is a high (H) level and transfers the charge (electron) which is photoelectrically converted and accumulated in the photodiods PD21 to the floating diffusion FD21.

The reset transistor RBT1-Tr is connected between a power supply line Vdd of a power supply voltage VDD and the floating diffusion FD21 and is controlled by a control signal RST applied to the gate through a control line. The reset transistor RST1-Tr is selected and becomes conductive in a reset period where the control signal RST is the H level and resets the floating diffusion FD21 to the potential of the power supply line Vdd of the power supply voltage VDD.

The source follower transistor SF1-Tr and the selection transistor SEL1-Tr are connected in series between the power supply line Vdd and the first vertical signal line LSGN11 driven by the constant current source Ibias1. The output node ND21 is formed by a connection point of the source of the source follower transistor SF1-Tr and the drain of the selection transistor SEL1-Tr. A signal line LSGN13 between this output node ND21 and the input part of the signal holding part 212 is for example driven by a constant current source Ibias3 arranged at the input part of the signal holding part 212. The source follower transistor SF1-Tr outputs the read-out voltage (VRST1, VSIG1) of the column output, which is obtained by converting the charge in the floating diffusion FD21 to a voltage signal corresponding to the charge amount (potential), to the output node ND21.

At the gate of the source follower transistor SF1-Tr, the floating diffusion FD21 is connected. The selection transistor SEL1-Tr is controlled by a control signal SEL applied to the gate through a control line. The selection transistor SEL1-Tr is selected and becomes conductive in a selection period where the control signal SEL is the H level. Due to this, the source follower transistor SF1-Tr outputs the read-out voltage (VRST1, VSIG1) of the column output, which is obtained by converting the charge in the floating diffusion FD21 to a voltage signal corresponding to the charge amount (potential), to the first vertical signal line LSGN11.

The signal holding part 212 of the first pixel 21 basically includes an input part 2121 to which the constant current source Ibias3 is connected, a sample and hold part 2122, an output part 2123, and nodes ND22 to ND24. Note that, the node ND22 corresponds to the input node, the node ND23 corresponds to a first holding node, and the node ND24 corresponds to a second holding node.

The constant current source Ibias3 is connected between the node ND22 and the reference potential VSS and is for example controlled ON in a predetermined time period during the global shutter period.

Note that, in place of the constant current source Ibias3, a switch element which is connected between the node ND22 and the reference potential VSS and is for example controlled ON in a predetermined time period during the global shutter period may be provided as well.

The sample and hold part 2122 has a first switch element SW21 which selectively connects the signal holding capacitor of the sample and hold part 2122 with the output node ND21 of the photoelectric conversion reading part 211 in the second period of the global shutter period, a first signal holding capacitor C21 and second signal holding capacitor C22 capable of holding the signal output from the output node ND21 of the photoelectric conversion reading part 211 of the first pixel 21, and a second switch element SW22. A terminal "a" of the first switch element SW21 is connected to an input node ND22 connected to a third signal line LSGN13, while a terminal "b" is connected to a node ND23 connected to the sample and hold part 2122 side. The first switch element SW21 becomes conductive by connection of the terminals "a" and "b" in for example a period where the signal awl is a high level. The first signal holding capacitor C21 is connected between the first holding node of the node ND23 and the reference potential VSS. The second signal holding capacitor C22 is connected between the second holding node of the node ND24 and the reference potential VSS. The terminal "a" of the second switch element SW22 is connected to the node ND23, and the terminal "b" is connected to the node ND24. The second switch element SW22 becomes conductive by connection of the terminals "a" and "b" in for example a period where the signal SHRT is a high level.

The output part 2123 includes a source follower transistor SF3-Tr which outputs signals held in the signal holding capacitors C21 and C22 in accordance with the held voltage in the second period of the global shutter period and selectively outputs the held signals through the selection transistor SEL3-Tr to the second vertical signal line LSGN12 driven by the constant current source Ibias1.

The source follower transistor SF3-Tr and the selection transistor SEL3-Tr are connected in series between the power supply line Vdd and the second vertical signal line LSGN12 driven by the constant current source Ibias1.

The gate of the source follower transistor SF3-Tr is connected to a node ND24. The selection transistor SEL3-Tr is controlled by a control signal SEL3 supplied to the gate through a control line. The selection transistor SEL3-Tr is selected and becomes conductive in the selection period where the control signal SEL3 is the H level. Due to this, the source follower transistor SF3-Tr outputs the read-out voltage (VRST1, VSIG1) of the column output in accordance with the held voltages of the signal holding capacitors C21 and C22 to the second vertical signal line LSGN12.

Note that, the configuration of the signal holding part 212 described above is one example. Its configuration is not an issue so far as the circuit is provided with the function of holding the read-out voltage (signal voltage) (VRST1, VSIG1) output by the photoelectric conversion reading part 211 in the second period of the global shutter period.

A second pixel 22 arranged in the pixel portion 20 includes a photoelectric conversion reading part 221. The photoelectric conversion reading part 221 in the second pixel 22 has the same configuration as that of the photoelectric conversion reading part 211 in the first pixel 21 explained above.

That is, the photoelectric conversion reading part 221 in the second pixel 22 includes a photodiode (photoelectric conversion element) and pixel amplifier. Specifically, this photoelectric conversion reading part 221 for example has a photoelectric conversion element comprised of the photodiode PD22. This photodiode PD22 is provided with a transfer element comprised of a transfer transistor TG2-Tr, a reset element comprised of a reset transistor RST2-Tr, a source follower element comprised of a source follower transistor SF2-Tr, and a selection element (selection switch) comprised of a selection transistor SEL2-Tr. In this way, the photoelectric conversion reading part 221 in the second pixel 22 according to the first embodiment includes four transistors (4Tr) of the transfer transistor TG2-Tr, reset transistor RST2-Tr, source follower transistor SF2-Tr, and selection transistor SEL2-Tr.

The photoelectric conversion reading part 221 according to the first embodiment outputs the read-out voltage (signal voltage) (VRST2, VSIG2) to the first vertical signal line LSGN11 at the time of the rolling shutter mode.

The photodiode PD22 generates and accumulates (stores) an amount of signal charge (here, electrons) corresponding to an incident light quantity. Below as well, the case where a signal charge is electrons and each transistor is an n-type transistor will be explained, however, the signal charge may be a hole or each transistor may be a p-type transistor. Further, the present embodiment is effective also in a case where each transistor is shared among a plurality of photodiodes and transfer transistors.

The transfer transistor TG2-Tr in the photoelectric conversion reading part 221 is connected between the photodiode PD22 and the floating diffusion FD22 and is controlled by a control signal TG applied to the gate through a control line. The transfer transistor TG2-Tr is selected and becomes conductive in the transfer period where the control signal TG is the H level and transfers the charge (electrons) which is photoelectrically converted and accumulated in the photodiode PD22 to the floating diffusion FD22.

The reset transistor RST2-Tr is connected between the power supply line Vdd of power supply voltage VDD and the floating diffusion FD22 and is controlled by the control signal RST supplied to the gate through the control line. The reset transistor RST2-Tr is selected and becomes conductive in the reset period where the control signal RST is the H level and resets the floating diffusion FD22 to the potential of the power supply line Vdd of the power supply voltage VDD.

The source follower transistor SF2-Tr and the selection transistor SEL2-Tr are connected in series between the power supply line Vdd and the first vertical signal line LSGN11 driven by the constant current source Ibias1.

The gate of the source follower transistor SF2-Tr is connected to the floating diffusion FD22. The selection transistor SEL2-Tr is controlled by the control signal SEL supplied to the gate through the control line. The selection transistor SEL2-Tr is selected and becomes conductive in the selection period where the control signal SEL is the H level. Due to this, the source follower transistor SF2-Tr outputs the read-out voltage (VRST12, VSIG2) of the column output, which is obtained by converting the charge in the floating diffusion FD22 to a voltage signal corresponding to the charge amount (potential), to the first vertical signal line LSGN11.

Figure 3:
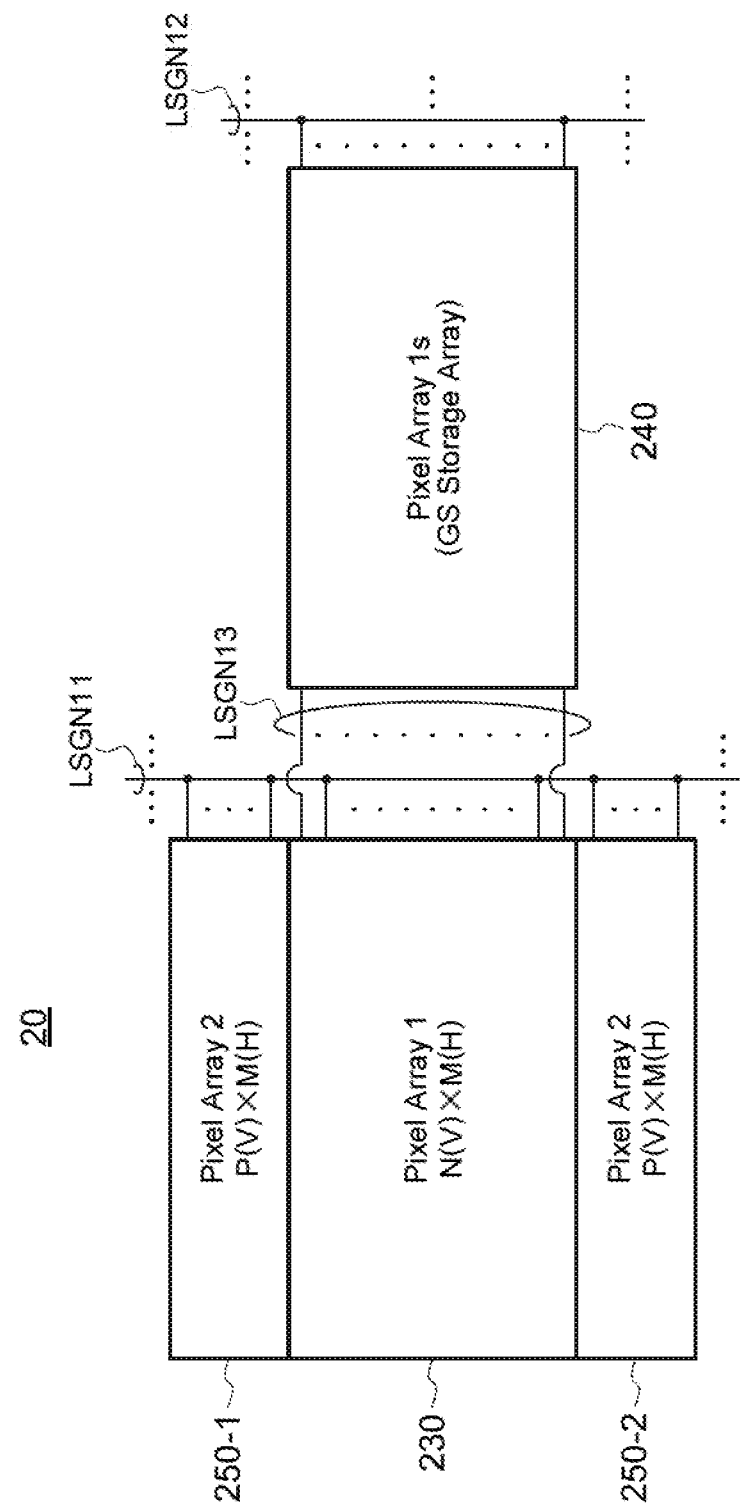
FIG. 3 is a view for explaining a pixel array in a pixel portion of the solid-state imaging device according to the first embodiment of the present invention.

The pixel portion 20 according to the first embodiment is comprised of first pixels 21 and second pixels 22 having the configurations described above for example arranged as a pixel array as shown in FIG. 3. A plurality of pixel arrays are combined.

FIG. 3 is a view for explaining a pixel array in the pixel portion 20 in the solid-state imaging device 10 according to the first embodiment of the present invention.

The pixel portion 20 in the solid-state imaging device 10 according to the first embodiment includes a first pixel array 230, holding part array 240, upper side (for example one side) second pixel array 250-1, and lower side (other side) second pixel array 250-2.

In the first pixel array 230, the plurality of photoelectric conversion reading parts 211 of the first pixels 21 are arranged in a two-dimensional matrix comprised of N rows and M columns. In the first pixel array 230, for example, the plurality of photoelectric conversion reading parts 211 of the first pixels 21 are arranged in a two-dimensional matrix comprised of N rows and M columns so that an image having an aspect ratio of for example 16:9 can be output.

In the holding part array 240, corresponding to the first pixel array 230, the plurality of signal holding parts 212 of the first pixels 21 are arranged in a two-dimensional matrix comprised of N rows and M columns. In the holding part array 240, in the same way as the first pixel array 230, the plurality of signal holding parts 212 of first pixels 21 are arranged in the two-dimensional matrix comprised of N rows and K columns so that an image having an aspect ratio of for example 16:9 can be output.

In the upper side second pixel array 250-1, a plurality of photoelectric conversion reading parts 221 of the second pixels 22 are arranged in a two-dimensional matrix comprised of P (P<N) rows and M columns.

In the same way, in the lower side pixel array 250-2, a plurality of photoelectric conversion reading parts 221 of second pixels 22 are arranged in a two-dimensional matrix comprised of P (P<N) rows and M columns.

In the example in FIG. 3, the second pixel arrays 250-1 and 250-2 are arranged on the two sides (upper side and lower side) of the first pixel array 230 in the wiring direction of the first vertical signal line LSGN11. Note that, the second pixel arrays 250 may be arranged at least at one side between the two sides of the first pixel array 230 in the wiring direction of the first vertical signal line LSGN11 as well.

The second pixel arrays 250-1 and 250-2 are made active together with the first pixel array 230 at the time of the rolling shutter mode. To enable an image having for example an aspect ratio of 1:1 to be output overall, in each, a plurality of photoelectric conversion reading parts 221 of the second pixels 22 are arranged in a two-dimensional matrix comprised of P (P<N) rows and M columns. The above aspect ratio may be any ratio such as 4:3 as well.

As described above, in the present embodiment, at the time of the second operation of the global shutter mode, the readout portion 70 can output an image having an aspect ratio corresponding to the aspect ratio of the first pixel array 230. More specifically, at the time of the second operation of the global shutter mode, the readout portion 70 can output an image having any aspect ratio that can be formed in the first pixel array 230. Further, at the time of the first operation of the rolling shutter mode, the readout portion 70 can output an image having any aspect ratio that can be formed in a composite pixel array formed by the first pixel array 230 and second pixel arrays 250 (−1, −2).

Note that, at the time of the rolling shutter mode, the first pixel array 230 may be utilized as a region for electronic shake compensation to output an image having a 16:9 aspect ratio as well.

Further, the photoelectric conversion reading parts 211 in the same columns in the first pixel array 230 and in the second pixel arrays 250-1 and 250-2 are connected to the common first vertical signal line LSGN11.

As will be explained later, when the solid-state imaging device 10 has a stacked structure of a first substrate (upper substrate) and a second substrate (lower substrate), the first pixel array 230 and second pixel arrays 250-1 and 250-2 are formed on the first substrate, while the holding part array 240 is formed on the second substrate so as to face the first pixel array 230.

In the pixel portion 20, under control of the readout portion 70, at the time of the first operation of the rolling shutter mode, the first pixel array 230 and the second pixel arrays 250-1 and 250-2 are made active so that the pixels are accessed in order and the pixel signals are read out in units of rows.

Further, in the pixel portion 20, under control of the readout portion 70, at the time of the second operation of the global shutter mode, the selection transistors SEL1-Tr and SEL2-Tr in the photoelectric conversion reading parts 211 and 221 in the first pixel array 230 and in the second pixel arrays 250-1 and 250-2 are rendered the non-selection state (the signals SEL are made the low level) and the first pixel array 230 and the holding part array 240 are made active to read out the pixel signals.

In the pixel portion 20, for example, the gates of the transfer transistors TG-Tr, reset transistors RST-Tr, and selection transistors SEL-Tr are connected in units of rows, therefore each row's worth of pixels is read simultaneously in parallel.

In the pixel portion 20, the pixels are arranged in (N+2P) rows and M columns, therefore the number of each of the control lines LSEL, LRST, and LTG is (N+2P) and the number of each of the first vertical signal lines LSGN11 and second vertical signal lines LSGN12 is M. In FIG. 1, the row control lines are represented by a single row scanning control line. In the same way, the vertical signal lines LSGN11 and LSGN12 are represented by a single vertical signal line.

The vertical scanning circuit 30 drives the photoelectric conversion reading parts 211 and signal holding parts 212 in the first pixels 21 and the photoelectric conversion reading parts 221 in the second pixels 22 through the row scanning control lines in the shutter rows and read rows according to the control by the timing control circuit 60. Further, the vertical scanning circuit 30 outputs row selection signals of the row address of the reading row for reading the signals and of the shutter row for resetting the charges accumulated in the photodiodes PD according to an address signal.

The column readout circuit 40 may be configured so as to include a plurality of column signal processing circuits (not shown) arranged corresponding to the column output of the pixel portion 20 so that column parallel processing is possible by the plurality of column signal processing circuits.

The column readout circuit 40 according to the first embodiment can include correlated double sampling (CDS) circuits and ADCs (analog-to-digital converters: AD converters), amplifiers (AMP), sample and hold (S/H) circuits, and so on.

Figure 4A:
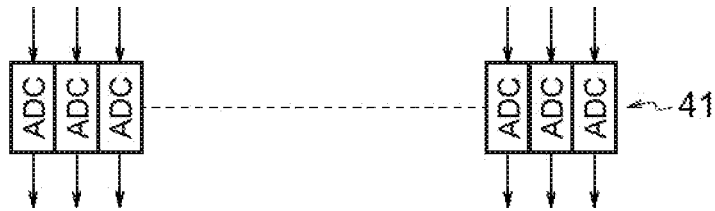
FIG. 4A to FIG. 4C are views for explaining an example of the configuration of a read-out system of column output of the pixel portion in a solid-state imaging device according to an embodiment of the present invention.
Figure 4B:
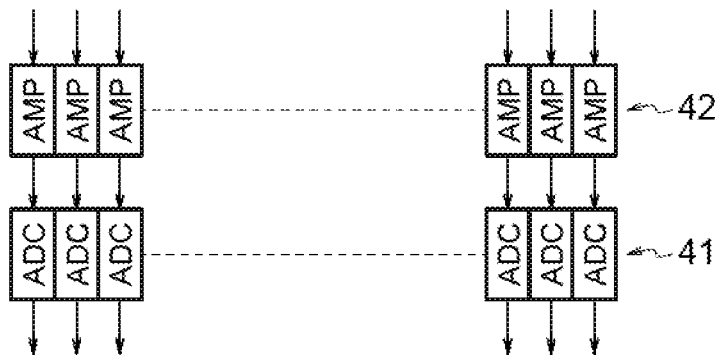
Figure 4C:
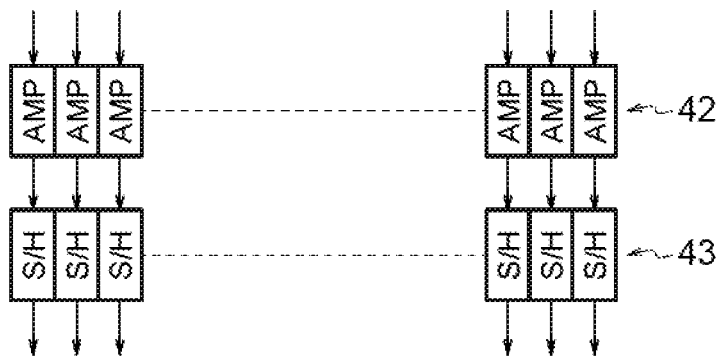

In this way, the column readout circuit 40, for example as shown in FIG. 4A, may include ADCs 41 converting the read-out signals VSL of the column output of the pixel portion 20 to digital signals. Otherwise, in the column readout circuit 40, for example as shown in FIG. 4B, amplifiers (AMP) 42 amplifying the read-out signals of the column output of the pixel portion 20 may be arranged. Further, in the column readout circuit 40, for example as shown in FIG. 4C, sample and hold (S/H) circuits 43 sampling and holding the read-out signals VSL of the column output of the pixel portion 20 may be arranged.

In the first embodiment, in the column readout circuit 40, for example the column signal processing circuit in each column has a circuit which selectively inputs a signal transmitted through the first vertical signal line LSGN11 and a signal transmitted through the second vertical signal line LSGN12 to the column signal processing circuit in each column according to the operation mode arranged therein.

The horizontal scanning circuit 50 scans the signals processed in the plurality of column signal processing circuits such as the ADCs in the column readout circuit 40, transfers the results to the horizontal direction, and outputs the same to a not shown signal processing circuit.

The timing control circuit 60 generates timing signals which are necessary for the signal processing of the pixel portion 20, vertical scanning circuit 30, column readout circuit 40, horizontal scanning circuit 50, etc.

The readout portion 70, at the time of the first operation of the rolling shutter mode, makes the first pixel array 230 and second pixel arrays 250-1 and 250-2 active to access the pixels in order and read the pixel signals in units of rows.

The readout portion 70, at the time of the second operation of the global shutter mode, renders the selection transistors SEL1-Tr and SEL2-Tr in the photoelectric conversion reading parts 211 and 221 in the first pixel array 230 and in the second pixel arrays 250-1 and 250-2 the non-selection state (makes the signals SEL the low level) then makes the first pixel array 230 and holding part array 240 active to read out the pixel signals.

Stacked Structure of Solid-State Imaging Device 10

Next, the stacked structure of the solid-state imaging device 10 according to the first embodiment will be explained.

Figure 5:
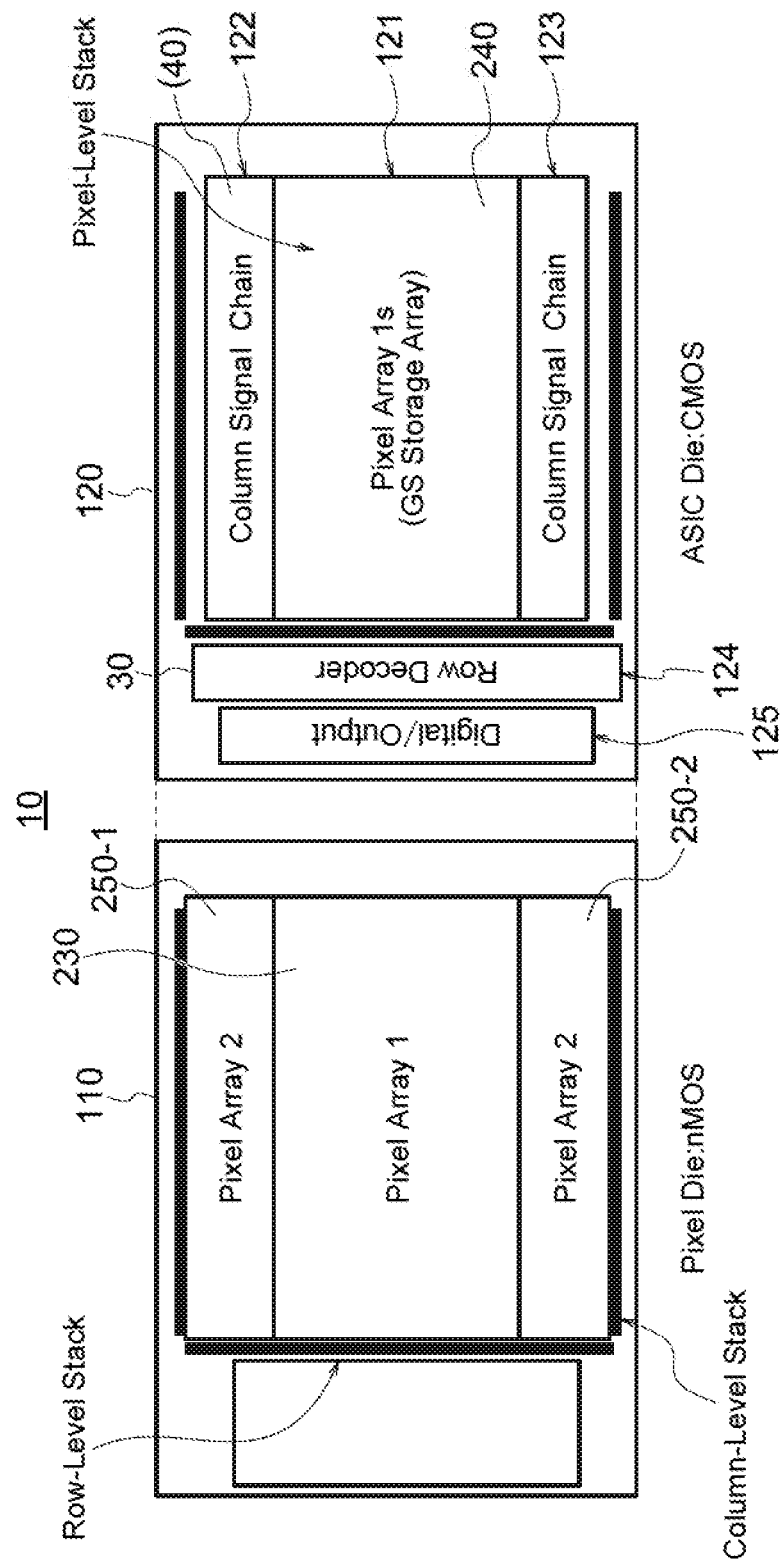
FIG. 5 is a view for explaining a stacked structure of the solid-state imaging device according to the first embodiment.

FIG. 5 is a diagram for explaining the stacked structure of the solid-state imaging device 10 according to the first embodiment.

The solid-state imaging device 10 according to the first embodiment has a stacked structure of a first substrate (upper substrate) 110 and a second substrate (lower substrate) 120. The solid-state imaging device 10 is for example formed as an imaging device of a stacked structure obtained by bonding two substrates at the wafer level and then cutting out the device by dicing. In the present example, it has a structure of the first substrate 110 stacked on the second substrate 120.

On the first substrate 110, the first pixel array 230 of the pixel portion 20 where the photoelectric conversion reading parts 211 of the first pixels 21 are arranged is formed centered on its center part, while the second pixel arrays 250-1 and 250-2 are formed at the two sides (upper side and lower side) of the first pixel array 230 in the wiring direction of the first vertical signal line LSGN11. Further, on the first substrate 110, the first vertical signal line LSGN11 is formed.

In this way, in the first embodiment, on the first substrate 110, the photoelectric conversion reading parts 211 of the first pixels 21 and photoelectric conversion reading parts 221 of the second pixels 22 are formed in a matrix.

On the second substrate 120, the holding part array 240 (region 121) where the signal holding parts 212 of the first pixels 21 to be connected to the output nodes ND21 of the photoelectric conversion reading parts 211 of the first pixel array 230 are arranged in a matrix and the second vertical signal line LSGN12 are formed centered on its center part. Further, around the holding part array 240, i.e., in the example in FIG. 5, on the upper side and lower side in the drawing, regions 122 and 123 for column readout circuits 40 are formed. Note that, the column readout circuit 40 may be arranged on either of the upper side or lower side of the region 121 of the holding part array 240. Further, on the lateral side of the holding part array 240, a region 124 for the vertical scanning circuit 30 and a region 125 for a digital and/or output system are formed. Further, on the second substrate 120, a vertical scanning circuit 30, horizontal scanning circuit 50, and timing control circuit 60 may also be formed.

In such a stacked structure, for example, as shown in FIG. 2, the output nodes ND21 of the photoelectric conversion reading parts 211 of the first pixel array 230 on the first substrate 110 and the input nodes ND22 of the signal holding parts 212 of the first pixels 21 on the second substrate 120 are electrically connected by using vies (die-to-die vias) or microbumps. Further, for example as shown in FIG. 2, the first vertical signal line LSGN11 on the first substrate 110 and the input part of the column readout circuit 40 on the second substrate 120 are electrically connected by using vias (die-to-die vias) or microbumps.

Readout Operation of Solid-State Imaging Device 10

Above, the characterizing configurations and functions of the parts in the solid-state imaging device 10 were explained. Next, the readout operations etc. of the solid-state imaging device 10 according to the first embodiment at the time of the global shutter mode and time of the rolling shutter mode will be explained in detail.

Readout Operation at Global Shutter Mode

First, the readout operation at the time of the global shutter mode will be explained. FIG. 6A to FIG. 6H are timing charts for explaining readout operations at the time of the global shutter mode in the solid-state imaging device according to the first embodiment.

Figure 6:
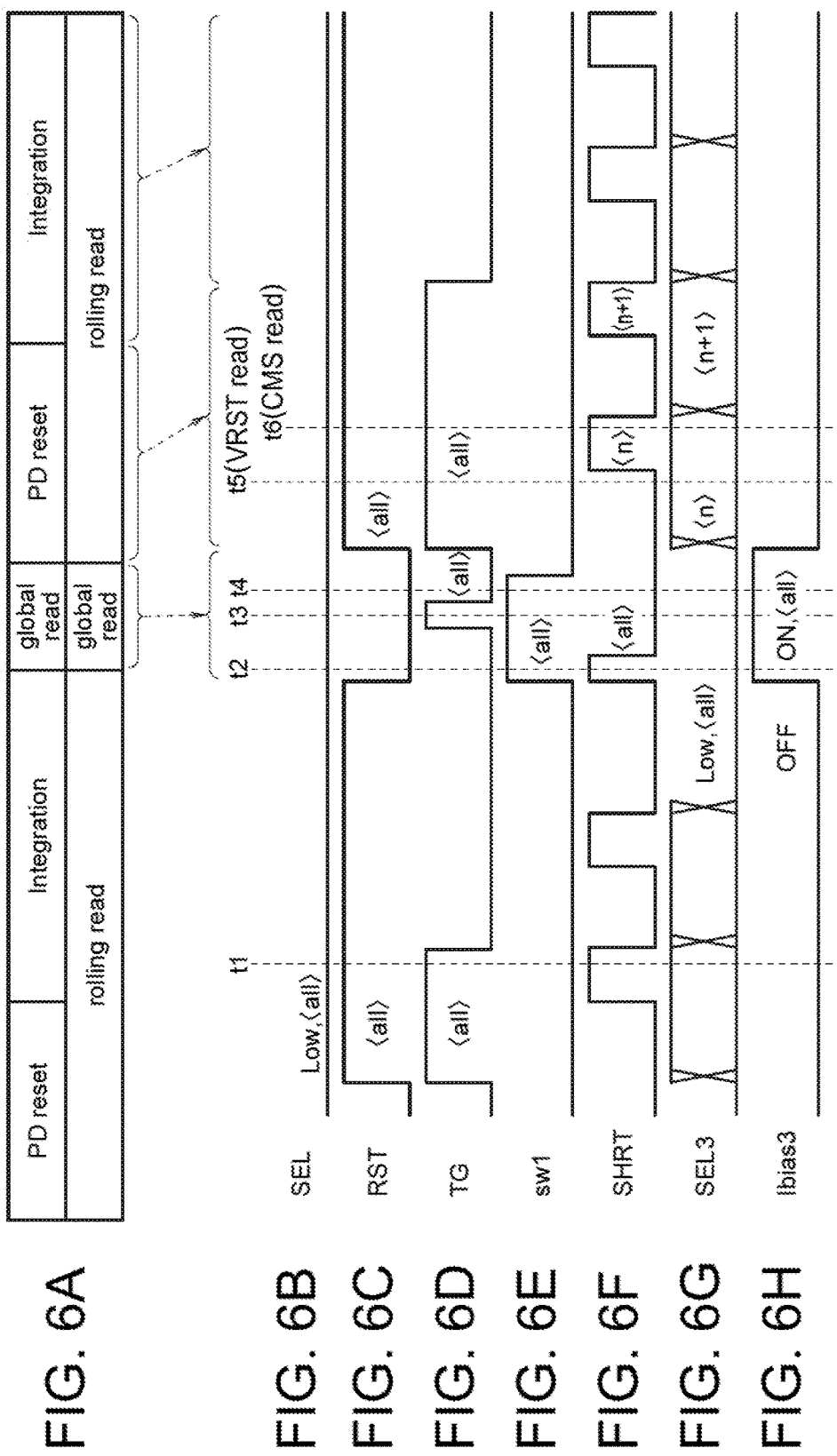
FIG. 6A to FIG. 6H are timing charts for explaining a readout operation at the time of a global shutter mode of the solid-state imaging device according to the first embodiment.

FIG. 6A shows the process of a readout operation at the time of the global shutter mode. FIG. 6B shows a control signal SEL of selection transistors SEL1-Tr and SEL2-Tr of a photoelectric conversion reading part 211 of a first pixel 21 and a photoelectric conversion reading part 221 of a second pixel 22. FIG. 6C shows a control signal RST of reset transistors RST1-Tr and RST2-Tr of a photoelectrio conversion reading part 211 of a first pixel 21 and a photoelectric conversion reading part 221 of a second pixel 22. FIG. 6D shows a control signal TG of transfer transistors TG1-Tr and TG2-Tr of a photoelectric conversion reading parts 211 of a first pixel 21 and a photoelectric conversion reading part 221 of a second pixel 22. FIG. 6E shows a control signal sw1 of a switch element SW21 of a signal holding part 212 of a first pixel 21. FIG. 6F shows a control signal SHRT of a switch element SW22 of a signal holding part 212 of a first pixel 21. FIG. 6G shows a control signal SEL3 of a selection transistor SEL3-Tr of a signal holding part 212 of a first pixel 21. FIG. 6H shows a drive state (ON, OFF state) of a constant current source Ibias3 arranged in a signal holding part 212 of a first pixel 21.

At the time of the global shutter mode, as shown in FIG. 6B, the control signal SEL of the selection transistors SEL1-Tr and SEL2-Tr of the photoelectric conversion reading part 211 of each first pixel 21 and the photoelectric conversion reading part 221 of each second pixel 22 is set at the low level (L) during the entire period of the global shutter mode. Due to this, throughout the entire period of the global shutter mode, the output of the voltage signals from the first pixel array 230 and second pixel arrays 250-1 and 250-2 to the first vertical signal line LSGN11 is suppressed (suspended). Accordingly, the second pixel arrays 250-1 and 250-2 are controlled to the inactive state. Further, the first pixel array 230 is in the active state, so is capable of outputting voltage signals from the output nodes ND21 to the signal holding parts 212. That is, at the time of the global shutter mode, among the first pixel array 230 and second pixel arrays 250-1 and 250-2, only the first pixel array 230 is in the active state, so it is possible to output an image having for example a 16-9 aspect ratio.

In FIG. 6B to FIG. 6H, the time t1 to t2 is the reset period of the photodiode PD21 and floating diffusion FD21 in all photoelectric conversion reading parts 211 of the first pixel array 230.

Note that, in this reset period, the control signal sw1 of the switch element SW21, the control signal SHRT controlling the switch element SW22, and the control signal SEL3 controlling the selection transistor SEL3-Tr for controlling the drive of all signal holding parts 212 in the holding part array 240 are set at the L level, the switch element SW21, switch element SW22, and selection transistor SEL3-Tr are controlled to the non-conductive state, and the constant current source Ibias3 are controlled to the OFF state.

In such a state, in the reset period, the reset transistor RST1-Tr is selected and becomes conductive in the time period where the control signal RST is the H level. Further, in the period where the control signal RST is the H level, the transfer transistor TG1-Tr is selected and becomes conductive in the time period where the control signal TG is the H level, the accumulation node (storage node) of the charge (electrons) which is photoelectrically converted and accumulated (stored) in the photodiode PD21 become conductive with the floating diffusion FD21, and the photodiode PD21 and floating diffusion FD21 are reset to the potential of the power supply line Vdd.

After reset of the photodiode PD21, the control signal TG of the transfer transistor TG1-Tr is switched to the L level, the transfer transistor TG1-Tr becomes the non-conductive state, and the photoelectrically converted charge starts to be accumulated in the photodiode PD21. At this time, the control signal RST of the reset transistor RST1-Tr is held at the H level, therefore the floating diffusion FD21 is held in a state reset to the potential of the power supply line Vdd. Further, for ending the reset period, the control signal RST of the reset transistor RST1-Tr is switched to the L level, and the reset transistor RST1-Tr become the non-conductive state.

Next, the time t2 to t3 is the period of reading the pixel signal at the time of the reset state and holding the readout reset signal VRST at the signal holding capacitor C22 of the signal holding part 212.

In the photoelectric conversion reading part 211, the charge in the floating diffusion FD21 is converted to a voltage signal with a gain in accordance with the charge amount (potential) by the source follower transistor SF1-Tr and is output as the readout reset signal VRST of column output from the output node ND21.

In the photoelectrio conversion reading part 211, in parallel to the timing where the control signal RST of the reset transistor RST1-Tr is switched to the L level, all of the signal holding parts 212 in the holding part array 240 perform the following control. In the signal holding part 212, the control signal sw1 is switched to the H level whereby the switch element SW21 becomes the conductive state, the control signal SHRT is switched to the H level whereby the switch element SW22 become the conductive state, and the constant current source Ibias3 becomes the ON state.

Due to this, at the time t2, the readout reset signal VRST output from the output node ND21 of the photoelectric conversion reading part 211 is transmitted through the third signal line LSGN13 to the corresponding signal holding part 212 and is held in the signal holding capacitor C22 through the switch element SW21 and switch element SW22.

Further, the control signal awl is the H level whereby the switch element SW21 is held in the conductive state. In the state where the constant current source Ibias3 is held in the ON state, the control signal SHRT is switched to the L level whereby the switch element SW22 becomes the non-conductive state.

Here, the predetermined period including the time t3 becomes the transfer period. In the transfer period, in the photoelectric conversion reading part 211, the transfer transistor TG1-Tr is selected and becomes conductive in the time period where the control signal TG is the H level, so the charge (electrons) which is photoelectrically converted and accumulated in the photodiode PD21 is transferred to the floating diffusion FD21. When the transfer period ends, the control signal TG of the transfer transistor TG1-Tr is switched to L level whereby the transfer transistor TG1-Tr becomes the non-conductive state.

In this state, at the time t4, in the photoelectrio conversion reading part 211, the charge in the floating diffusion FD21 is converted to a voltage signal with a gain in accordance with the charge amount (potential) by the source follower transistor SF1-Tr and is output as the read-out signal VSIG of column output from the output node ND21.

Further, at the time t4, the readout signal VSIG output from the output node ND21 of the photoelectric conversion reading part 211 is transmitted through the third signal line LSGN13 to the corresponding signal holding part 212 and is held in the signal holding capacitor C21 through the switch element SW21.

After holding the readout signal VSIG in the signal holding capacitor C21, the control signal sw1 is switched to the L level and the switch element SW21 becomes the non-conductive state. After that, the constant current source Ibias3 is switched to the OFF state.

In order to read out the signal held in this state, for selecting a certain row in the holding part array 240, the control signal SEL3 of the selection transistor SEL-Tr in that selected row is set at the H level whereby the selection transistor SEL3-Tr becomes the conductive state. Further, at the time t5, the readout reset signal VRST held in the signal holding capacitor C22 is read out. At this time, in the signal holding part 212, due to the source follower transistor SF3-Tr having the gate connected to the node ND24, the signal is output as the readout reset signal VRST of column output to the second vertical signal line LSGN12 in accordance with the held voltage of the signal holding capacitor C22 connected to the node ND24, is supplied to the column readout circuit 40, and is for example held.

Next, for a predetermined period including the time t6, the control signal SHRT is held at the H level and the switch element SW22 is held in the conductive state. Further, at the time t6, a composite signal of the readout signal VSIG held in the signal holding capacitor C21 and the readout reset signal VRST held in the signal holding capacitor C22 is read out. The composite signal CMS can be represented by the following equation:

$$CMS = ((C1/(C1+C2)) \cdot VSIG + (C2/(C1+C2)) \cdot VRST) \quad \text{Equation 1}$$

where, C1 represents the capacity of a signal holding capacitor C21, and C2 represents the capacity of a signal holding capacitor C22.

At this time, in the signal holding part 212, due to the source follower transistor SF3-Tr having gates connected to the node ND23 and node ND24, the signal is output as the readout composite signal CMS of column output to the second vertical signal line LSGN12 in accordance with the held voltage of the signal holding capacitor C21 connected to the node ND23 and the held voltage of the signal holding capacitor C22 connected to the node ND24, is supplied to the column readout circuit 40, and is for example held.

Further, in for example the column readout circuit 40 configuring a portion of the readout portion 70, a difference (VRST-CMS) between the readout reset signal VRST read out at the time t5 and the composite signal CMS read out at the time t6 is taken and CDS processing is carried out.

$$VRST - CMS = VRST - ((C1/(C1+C2)) \cdot VSIG + (C2/(C1+C2)) \cdot VRST) = (C1/(C1+C2)) \cdot (VRST - VSIG) \quad \text{Equation 2}$$

Readout Operation at Rolling Shutter Mode

Next, a readout operation at the time of the rolling shutter mode will be explained. FIG. 7A to FIG. 7D are timing charts for explaining the readout operation at the time of the rolling shutter mode in the solid-state imaging device according to the first embodiment.

Figure 7:
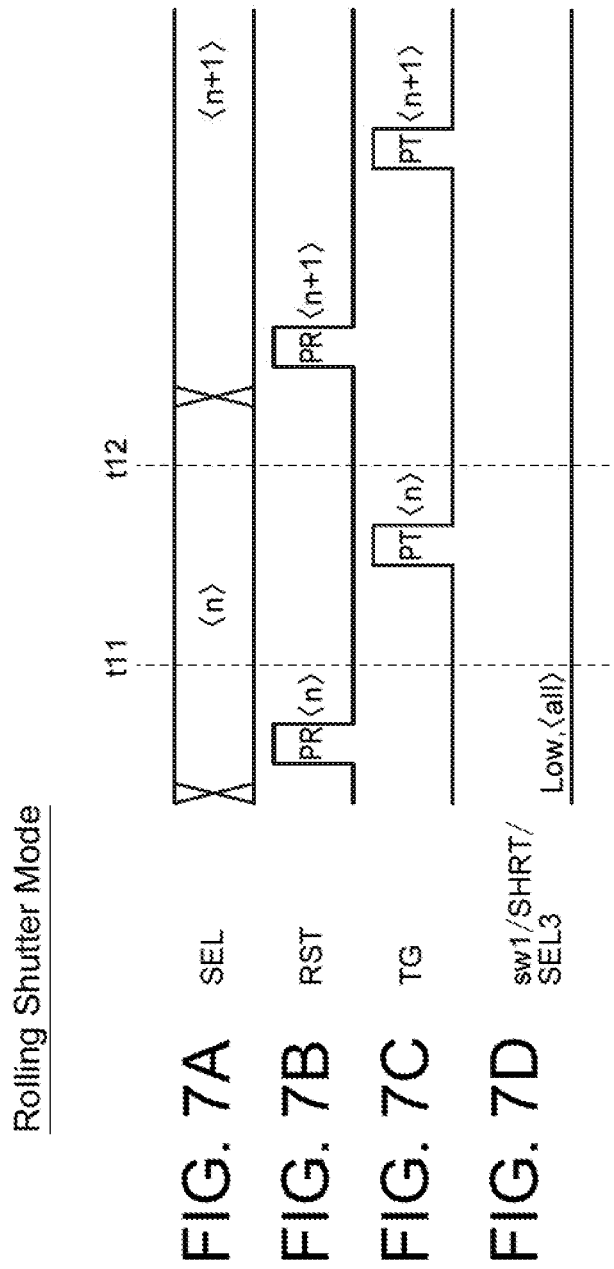
FIG. 7A to FIG. 7D are timing charts for explaining a readout operation at the time of a rolling shutter mode of the solid-state imaging device according to the first embodiment.

FIG. 7A shows a control signal SEL of selection transistors SEL1-Tr and SEL2-Tr of a photoelectric conversion reading part 211 in a first pixel 21 and a photoelectric conversion reading part 221 of a second pixel 22. FIG. 7B shows a control signal RST of reset transistors RST1-Tr and RST2-Tr of a photoelectric conversion reading part 211 of a first pixel 21 and a photoelectric conversion reading part 221 of a second pixel 22. FIG. 7C shows a control signal TG of transfer transistors TG1-Tr and TG2-Tr of a photoelectric conversion reading part 211 of a first pixel 21 and a photoelectric conversion reading part 221 of a second pixel 22. FIG. 7D shows a control signal sw1 of a switch element SW21, a control signal SHRT of a switch element SW22, and a control signal SEL3 of a selection transistor SEL3-Tr of a signal holding part 212 of a first pixel 21.

Note that, in this rolling shutter mode period, the control signal owl of the switch element SW21, the control signal SHRT controlling the switch element SW22, and the control signal SEL3 controlling the selection transistor SEL3-Tr for controlling drive of all signal holding parts 212 in the holding part array 240 are set at the L level whereby the switch element SW21, switch element SW22, and selection transistor SEL3-Tr are controlled to the non-conductive state.

That is, during the rolling shutter mode period, not all of the signal holding parts 212 in the holding part array 240 formed on the second substrate 120 are accessed. In the rolling shutter mode period, just the first pixel array 230 and second pixel arrays 250-1 and 250-2 formed on the first substrate 110 are accessed in order in units of rows. That is, at the time of the rolling shutter mode, the first pixel array 230 and second pixel arrays 250-1 and 250-2 are the active state. Therefore, for example, an image having an aspect ratio of 16:9 or images of 1:1 and 4:3 etc. which are different from 16:9 can be output.

In the rolling shutter mode, as shown in FIG. 7A, in order to select a certain row in the first pixel array 230 or second pixel arrays 250-1 and 250-2, a control signal SEL for controlling (driving) the photoelectric conversion reading part 211 of the first pixel array 230 or the photoelectric conversion reading parts 221 of the second pixel arrays 250-1 and 250-2 are set at the H level and the pixel selection transistor SEL2-Tr (or SEL1-Tr) becomes a conductive state.

In this selection state, in the reset period PR, the reset transistor RST2-Tr (or RST1-Tr) is selected and becomes conductive in the time period where the control line RST is the H level, then the floating diffusion FD22 (or FD21) is reset to the potential of the power supply line Vdd. After this reset period PR has passed (the reset transistor RST2-Tr or RST1-Tr becomes the non-conductive state), the period including the time t11 until the transfer period PT is started becomes the first readout period for reading the pixel signal at the time of the reset state.

At the time t11, due to the source follower transistor SF2-Tr (or SF1-Tr) of the selected row, the charge in the floating diffusion FD22 (or FD21) is converted to a voltage signal with a gain in accordance with the charge amount (potentials) and is immediately output as the readout reset signal VRST of column output to the first vertical signal line LSGN11, is supplied to the column readout circuit 40, and is for example held.

Here, the first readout period ends, and the transfer period PT arrives. In the transfer period PT, the transfer transistor TG2-Tr (or TG1-Tr) is selected and becomes conductive in the time period where the control signal TG is the high level (H), and the charge (electrons) which is photoelectrically and accumulated in the photodiode PD22 (or PD21) is transferred to the floating diffusion FD22 (or FD21). After this transfer period PT has passed (the transfer transistor TG2-Tr or TG1-Tr become the non-conductive state), the second readout period including the time t12 for reading the pixel signal in accordance with the charge which is photoelectrically converted and accumulated by the photodiodes PD22 (or PD21) arrives.

At the time t12 when the second readout period is started, due to the source follower transistor SF2-Tr (or SF1-Tr) of the selected row, the charge in the floating diffusion FD22 (or FD21) is converted to a voltage signal with a gain in accordance with the charge amount (potential), is immediately output as the readout signal VSIG of column output to the first vertical signal line LSGN11, is supplied to the column readout circuit 40, and is for example held.

Further, for example in the column readout circuit 40 configuring a portion of the readout portion 70, a difference (VRST-VSIG) between the readout reset signal VRST and the readout signal VSIG is taken and CDS processing is carried out.

As explained above, in the rolling shutter mode period, the first pixel array 230 and second pixel arrays 250-1 and 250-2 formed on the first substrate 110 are accessed in order in units of rows, and the readout operation explained above is carried out in order.

As explained above, according to the first embodiment, the solid-state imaging device 10 is configured as for example a stacked type CMOS image sensor having a pixel portion 20 comprised of pixels including first pixels 21 including photoelectric conversion reading parts and signal holding parts and second pixels 22 including photoelectric conversion reading parts mixed together and having both the operation functions of a first operation of a rolling shutter and a second operation of a global shutter together. In the solid-state imaging device 10 according to the first embodiment, the pixel portion 20 includes a first pixel array 230 in which the plurality of photoelectric conversion reading parts 211 of the first pixels 21 are arranged in a matrix, a holding part array 240 in which the plurality of signal holding parts 212 of the first pixels 21 are arranged in a matrix, and second pixel arrays 250-1 and 250-2 in which the plurality of photoelectric conversion reading parts 221 of the second pixels are arranged in a matrix. Further, at the time of the first operation of the rolling shutter mode, the readout signals of the photoelectric conversion reading parts 211 and 221 of the first pixels 21 and second pixels 22 are immediately output to the first vertical signal line LSGN11 without following the bypass route. Further, at the time of the second operation of the global shutter mode, the held signals of the signal holding parts 212 of the first pixels are output to the second vertical signal line LSGN12.

Accordingly, according to the solid-state imaging device 10 of the first embodiment, complication of the configuration is prevented, while a drop of the area efficiency in layout can be prevented.

Further, according to the solid-state imaging device 10 of the first embodiment, an image signal having a desired aspect ratio can be obtained according to the operation mode.

Further, the solid-state imaging device 10 according to the first embodiment has a stacked structure of a first substrate (upper substrate) 110 and a second substrate (lower substrate) 120. On the first substrate 110, the first pixel array 230 of the pixel portion 20 where the photoelectric conversion reading parts 211 of the first pixels 21 are arranged is formed centered on its center part, while the second pixel arrays 250-1 and 250-2 are formed at the two sides (upper side and lower side) of the first pixel array 230 in the wiring direction of the first vertical signal line LSGN11. Further, on the first substrate 110, the first vertical signal line LSGN11 is formed. On the second substrate 120, the holding part array 240 (region 121) where the signal holding parts 212 of the first pixels 21 to be connected to the output nodes ND21 of the photoelectric conversion reading parts 211 of the first pixel array 230 are arranged in a matrix and the second vertical signal line LSGN12 are formed centered on its center part. Further, around the holding part array 240, regions 122 and 123 for column readout circuits 40 are formed.

Accordingly, in the first embodiment, by basically forming the first substrate 110 side by only NMOS elements and expanding the valid pixel region up to the maximum limit by pixels in the first pixel array and in the second pixel arrays, the cost value can be raised to the maximum.

Second Embodiment

Figure 8:
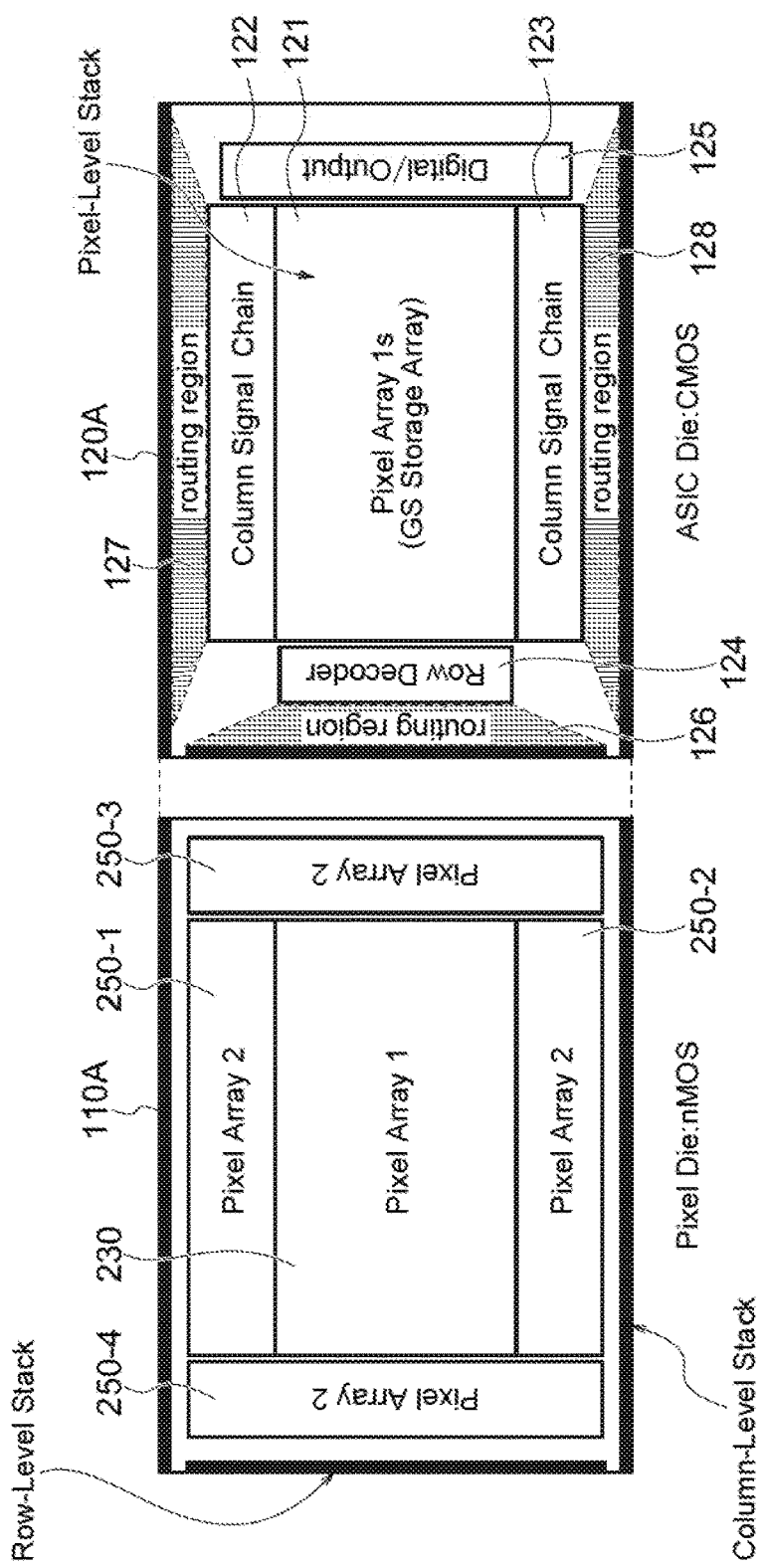
FIG. 8 is a view for explaining a stacked structure of a solid-state imaging device according to a second embodiment of the present invention.

FIG. 8 is a view for explaining a stacked structure of a solid-state imaging device according to a second embodiment of the present invention.

The difference of the stacked structure of the second embodiment from the stacked structure of the first embodiment is as follows. In the stacked structure in the second embodiment, a region 124 for the vertical scanning circuit (row decoder) 30 and regions 122 and 123 for the column readout circuit system (column signal chain) which are provided on the second substrate 120A are arranged with a smaller pitch than the pixel pitch. Further, by securing routing regions 126 to 128 in the peripheral part of the second substrate 120A, the wiring pitch is made to match the pixel pitch of the first substrate 110A.

Further, in the stacked structure of the second embodiment, on a first substrate 110A, second pixel arrays 250-3 and 250-4 for a rolling shutter are formed at the two side portions of the first pixel array 230 and second pixel arrays 250-1 and 250-2. Due to this, at the time of the rolling shutter mode operation and time of the global shutter mode operation, it becomes possible to output image signals having the same or any aspect ratio.

Third Embodiment

Figure 9:
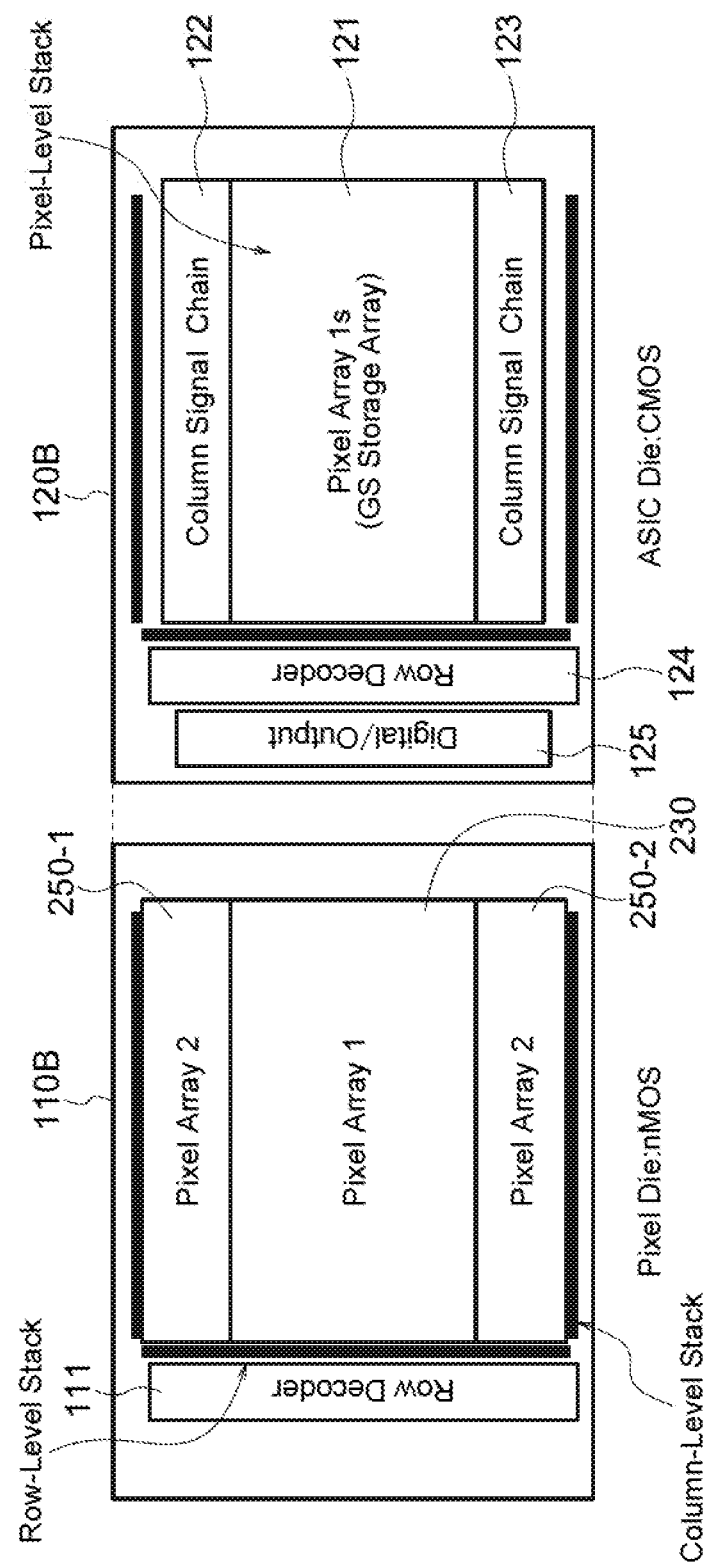
FIG. 9 is a view for explaining a stacked structure of a solid-state imaging device according to a third embodiment of the present invention.
Figure 10A:
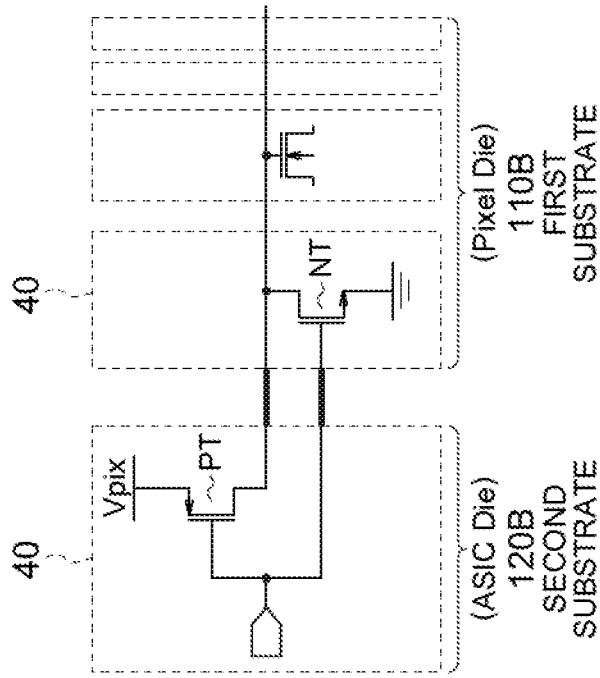
FIG. 10A and FIG. 10B are views showing an example of arrangement of components of a vertical scanning circuit in the stacked structure of the solid-state imaging device according to the third embodiment of the present invention.
Figure 10B:
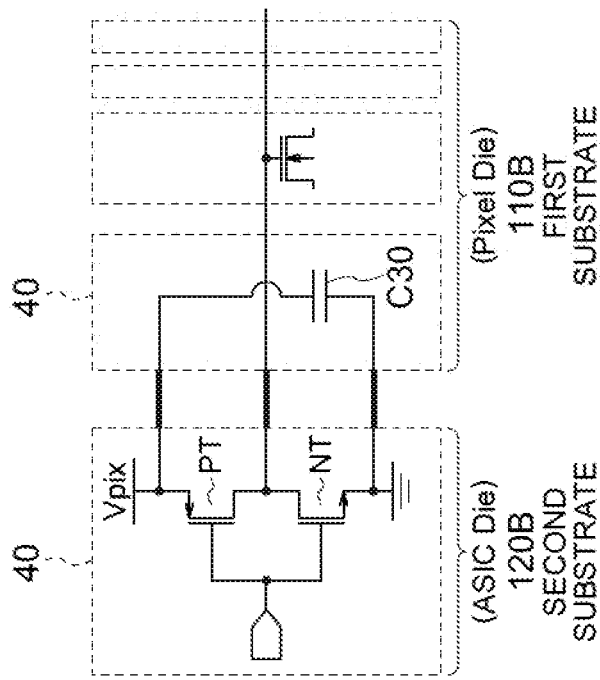

FIG. 9 is a view for explaining a stacked structure of a solid-state imaging device according to a third embodiment of the present invention. FIG. 10A and FIG. 10B are views showing examples of arrangement of the components of the vertical scanning circuit in the stacked structure of the solid-state imaging device according to the third embodiment of the present invention.

The difference of the stacked structure in the third embodiment from the stacked structure in the first embodiment is as follows. In the stacked structure in the third embodiment, a portion of the region 124 of the vertical scanning circuit (row decoder) provided on a second substrate 120B is formed as a region 111 on a first substrate 110B, and a portion of the components is arranged in the region 111 on the first substrate 110B.

In the example in FIG. 10A, in the region 111 on the first substrate 110B, a power supply stabilization capacitor C30 of the vertical scanning circuit (row decoder) is arranged. Due to this, effective utilization of an empty region on the first substrate 110B on which basically only the pixel system is formed can be achieved. Therefore, by building in the stabilization capacitor C30, the number of external members can be reduced.

In the example in FIG. 10B, between the p-channel MOB (PMOS) transistor PT and the n-channel MOS (NMOS) transistor NT which configure the driver of the vertical scanning circuit (row decoder) 30, the PMOS transistor PT is arranged on the second substrate 120B, and the NMOS transistor NT is arranged on the first substrate 110B. Due to this, basically the NMOS transistor NT is formed on the first substrate 110B which is formed by elements of NMOS system, therefore design and manufacture become easy, so the empty region on the first substrate 110B can be effectively utilized.

Fourth Embodiment

Figure 11:
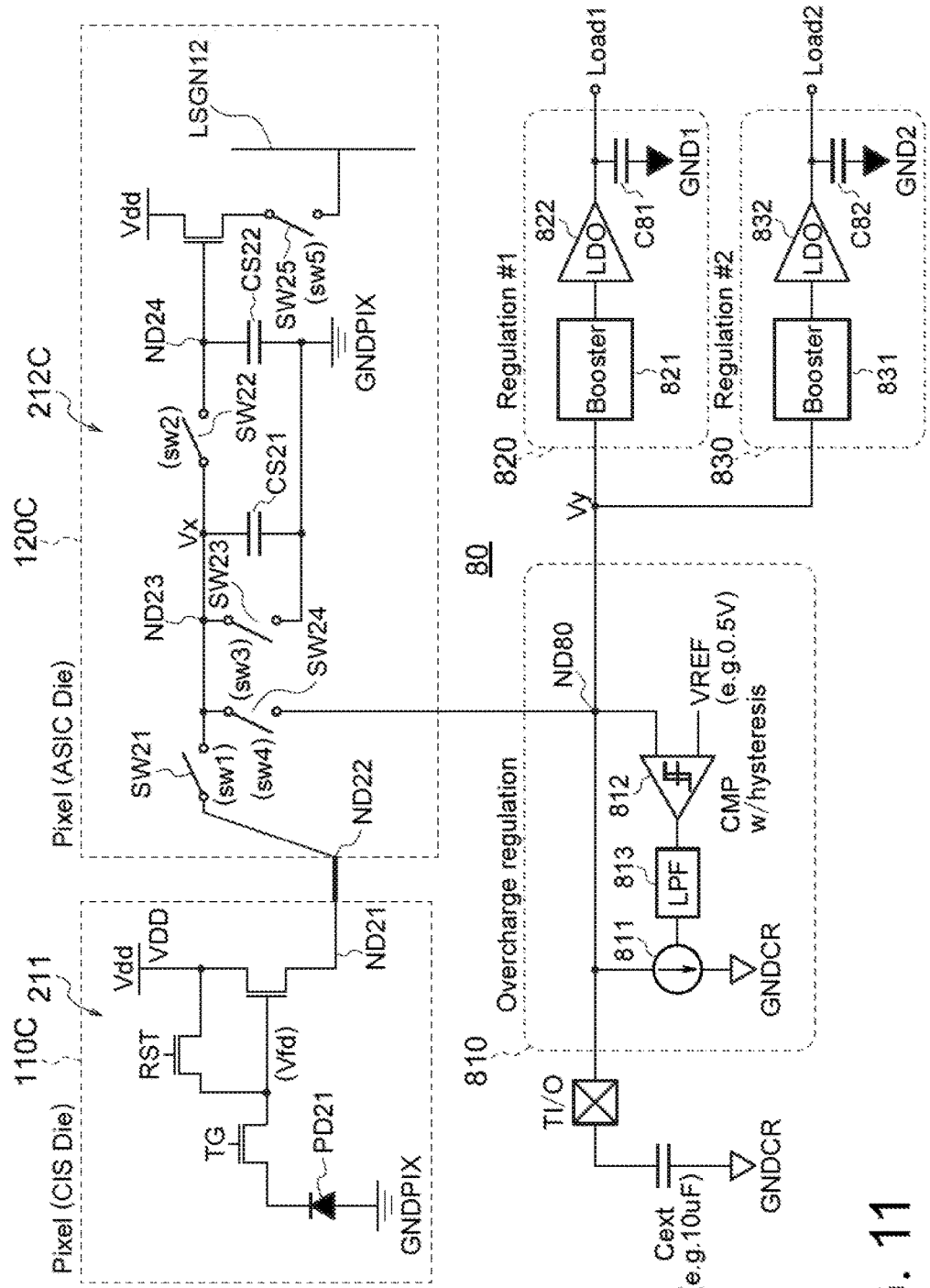
FIG. 11 is a view showing an example of the configuration of a charge regeneration system according to a fourth embodiment of the present invention.

FIG. 11 is a view showing an example of the configuration of a charge regeneration system according to a fourth embodiment of the present invention.

A solid-state imaging device 10 of the fourth embodiment is provided with a charge regeneration (charge recycle) system 80 in addition to the configurations in the first to third embodiments.

The charge re-utilization part comprised of the present charge regeneration system 80 includes an external capacitor Cext, signal holding part 212C, overcharge regulate circuit 810, and regulators 820 and 830. Note that, a power supply circuit part is configured by the overcharge regulate circuit 810 and regulators 820 and 830.

Note that, in the signal holding part 212C in FIG. 11, the third switch element SW23 is arranged in place of the constant current source Ibias3, and the selection transistor is provided as the switch element SW25, but the result is the same as the signal holding part 212 in FIG. 2 in function except for the external connection switch element comprised of the switch element SW24.

The present charge regeneration system 80 transfers the charges stored in the first signal holding capacitors (sampling capacitances) CS21 and second signal holding capacitors (sampling capacitance) CS22 of the signal holding parts 212C in all of the first pixels 21 to the external capacitor Cext having a large capacity at the outside and re-uses the same as the power supply of the digital circuit of its own chip. Due to this, the power consumption of the chip can be reduced.

An external connection switch element comprised of the switch element SW24 is connected between the first holding node of the signal holding part 212C comprised of the node ND23 and the node ND80 connected to the input/output terminal TI/O and is controlled in conductive state by a control signal sw4.

The external capacitor Cext is set in capacity to about 10 μF. This external capacitor Cext may be formed on the chip as well. For example, it may be formed on a first substrate 110C as well. Due to this, the empty region on the first substrate 110C can be effectively utilized.

Example of Calculation of Capacity of External Capacitor Cext

Where CS=10 fF,
N=2M pixel, and
Ctot=2*CS*N=40 nF,
Cext is determined so as to satisfy the following equation (in order to suppress ripple to 1/100).
Cext>100*Ctot The overcharge regulate circuit 810 suppresses ripple and regulates the voltage with a low power consumption by using a current clamp circuit 811, hysteresis comparator 812, and low pass filter (LPF) 813. A discharge route which makes charges flow to another ground (GNDCR) without exerting any influence upon the circuit is formed to suppress power supply noise at the time of transfer of charges.

Set Value of Reference Voltage VREF of Hysteresis Comparator 812

The reference voltage VREF of the hysteresis comparator 812 is set to a low voltage (for example 0.5V at most) so that almost all of the charge in the signal holding capacitor CS can be transferred. If it is too low, a large capacity becomes necessary. If it is too high, the quantity of charge which can be recycled is reduced. Accordingly, considering the voltage at the time of re-use, about 0.5V is preferred.

The regulator 820 is configured by forming a boost circuit 821 for boosting low voltage to high voltage and an LDO regulator 822 on the chip. The regulator 830 is configured by forming a booster circuit 831 for boosting low voltage to high voltage and an LDO regulator 832 on the chip.

The regulators 820 and 830 are boosted from 0.5V to 1.2V (DVDD) or 1.8V (DVDDIO) by the boost circuits 821 and 831 and generate mainly the power supply voltage of the digital circuit (including the vertical scanning circuit (row decoder) 30). Note that, the number of the regulators may be any number as well.

In the charge regeneration system 80, the charges accumulated in the signal holding capacitors (sampling capacitances) CS21 and CS22 of the signal holding parts 212C in all of the first pixels 21 are transferred to the external capacitor Cext having a large capacity at the outside and are reused as the power supply of the digital circuit of its own chip. In the signal holding part 212C in a first pixel 21, the sampling circuit, finally, after resetting residual charges at a clean ground (GNDPIX), performs a so-called global sampling operation.

FIG. 12A to FIG. 12J are charts for explaining the operation of the charge regeneration system according to the fourth embodiment of the present invention.

Figure 12:
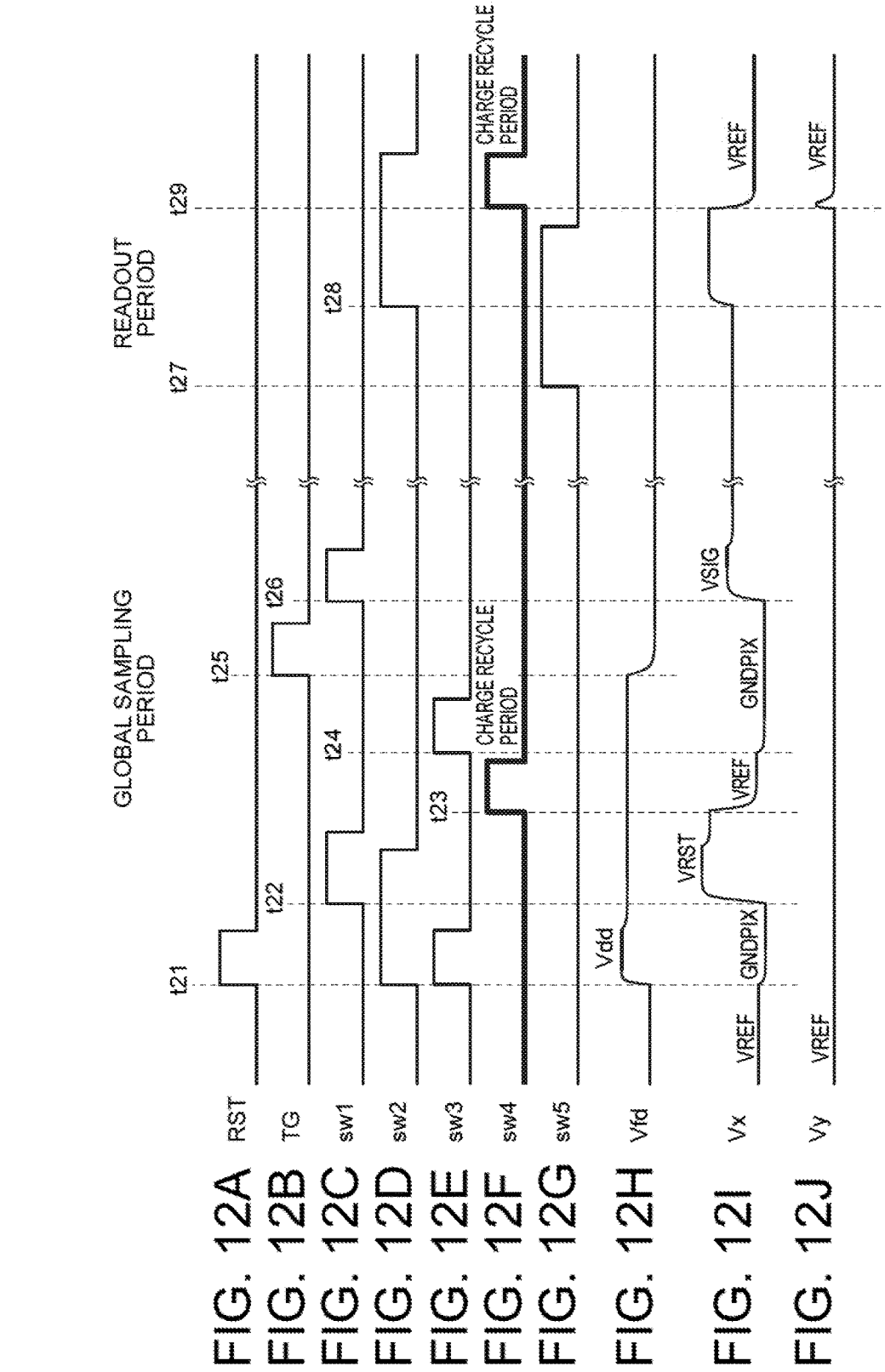
FIG. 12A to FIG. 12J are views for explaining the operation of the charge regeneration system according to the fourth embodiment of the present invention.

FIG. 12A shows a control signal RST of a reset transistor RST1-Tr of a photoelectric conversion reading part 211 in a first pixel 21. FIG. 12B shows a control signal TG of a transfer transistor TG1-Tr of a photoelectric conversion reading part 211 in the first pixel 21. FIG. 12C shows a control signal sw1 of a first switch element SW21 of a signal holding part 212C in the first pixel 21. FIG. 12D shows a control signal sw2 (SHRT) of a second switch element SW22 of a signal holding part 212C in the first pixel 21. FIG. 12E shows a control signal sw3 of a third switch element SW23 of the signal holding part 212C in the first pixel 21. FIG. 12F shows a control signal sw4 of a switch element sW24 as an external connection switch element of the signal holding part 212C in the first pixel 21. FIG. 12G shows a control signal sw5 (SEL3) of a switch element SW25 of the signal holding part 212C in the first pixel 21. FIG. 12H shows a potential Vfd of a floating diffusion FD21 of the photoelectric conversion reading part 211 in the first pixel 21. FIG. 12I shows a potential Vx of a node ND23 of the signal holding part 212C in the first pixel 21. FIG. 12J shows a potential Vy of a node ND80 of a charge regeneration system 80.

In FIG. 12A to FIG. 12J, t21 shows the start time of the global sampling period. At the time t21, the control signal RST is set at the H level and the reset transistor RST1-Tr becomes the conductive state. Due to this, the floating diffusion FD21 is reset to the potential of the power supply line Vdd. Further, the control signal sw2 is set at the H level and the switch element SW22 becomes the conductive state (ON state), therefore the first signal holding capacitor CS21 and the second signal holding capacitor CS22 are short-circuited (connected). Parallel to this, the control signal sw3 is set at the H level and the switch element SW23 becomes the conductive state (ON state). Due to this, the first signal holding capacitor CS21 and the second signal holding capacitor CS22 are connected to the ground GNDPIX and residual charges are removed.

In FIG. 12A to FIG. 12J, t22 shows the sampling start time of the reset voltage VRST. At the time t22, the control signal sw1 is set at the H level whereby the switch element SW21 becomes the conductive state (ON state), therefore the output node ND21 of the photoelectric conversion reading part 211 on the first substrate 110C side in the first pixel 21 and the node ND23 of the sample and hold part of the signal holding part 212C on the second substrate 120C side are connected. Further, the first signal holding capacitor CS21 and the second signal holding capacitor CS22 become the first pixel amplifier drive current sources which are dynamic together with the load capacitance, therefore the potential Vx of the node ND23 rises up to VRST. After that, the control signal sw2 is set at the L, the switch element SW22 becomes the non-conductive state (OFF state), and the reset voltage VRST is sampled in the signal holding capacitor CS22.

In FIG. 12A to FIG. 12J, t23 shows the first charge recycle start time. At the time t23, the control signal sw4 is set at the H level whereby the switch element SW24 becomes the conductive state (ON state), then the signal holding capacitor CS21 is connected to the external capacitor Cext and charges are transferred. As a result, the potential Vx of the node ND23 of the signal holding part 212C becomes VREF.

In FIG. 12A to FIG. 12J, t24 shows a sampling preparation period of the signal voltage VSIG. At the time t24, the control signal sw3 is set at the H level whereby the switch element SW23 becomes the conductive state (ON state). Due to this, the signal holding capacitor CS21 is connected to the ground GNDPIX and residual charge is removed.

In FIG. 12A to FIG. 12J, t25 shows the optical signal charge transfer period. At the time t25, the control signal TG is set at the H level, the transfer transistor TG1-Tr becomes the conductive state, and the photocharges (electrons) which are photoelectrically converted and accumulated in the photodiode PD21 are transferred to the floating diffusion FD21. As a result, the voltage Vfd of the floating diffusion FD21 falls in proportion to the charge amount.

In FIG. 12A to FIG. 12J, t26 shows the start time of the sampling period of the optical signal voltage VSIG. At the time t26, the control signal sw1 is set at the H level whereby the switch element SW21 becomes the conductive state (ON state), then the output node ND21 of the photoelectric conversion reading part 211 on the first substrate 110C side in the first pixel 21 and the node ND23 of the sample and hold part of the signal holding part 212C on the second substrate 120C side are connected again. As a result, the potential Vx of the node ND23 rises up to VSIG.

In FIG. 12A to FIG. 12J, t27 shows the readout period start time. At the time t27, the control signal sw5 is set at the H level whereby the switch element SW25 becomes the conductive state (ON state), then the output part of the signal holding part 212C and the second vertical signal line LSGN12 are connected. As a result, a voltage proportional to the voltage sampled in the signal holding capacitor CS22 appears on the second vertical signal line LSGN12.

In FIG. 12A to FIG. 12J, t28 shows the time of start of reading of the sampled optical signals. At the time t28, the control signal sw2 is set at the H level whereby the switch element SW22 becomes the conductive state (ON state), then the first signal holding capacitor CS21 and the second signal holding capacitor CS22 are short-circuited (connected). As a result, as described before, in accordance with the sampling voltages and capacitance values in the signal holding capacitors CS21 and CS22 (usually, the two are designed to the same value), the potential Vx of the node ND23 changes. The control signal sw5 is the H level, therefore a voltage proportional to the potential Vx of the node ND23 appears on the second vertical signal line LSGN12.

In FIG. 12A to FIG. 12J, t29 shows the second charge recycle start time. At the time t29, in a state where the control signal sw2 is the H level, the control signal sw4 is set at the H level whereby the switch element SW24 becomes the conductive state (ON state), then the signal holding capacitors CS21 and CS22 are connected to the external capacitor Cext. As a result, the charges which are used for the readout operation and are accumulated (stored) in the signal holding capacitors CS21 and CS22 are transferred to the external capacitor Cext and became charges for reuse. Further, the potential Vx of the node ND23 becomes VREF.

As described above, the present charge regeneration system 80 transfers the charges accumulated (stored) in the signal holding capacitors (sampling capacitors) CS21 and CS22 of the signal holding parts 212C in all of the first pixels 21 to the external capacitor Cext having a large capacity at the outside and reuses the same as the power supply of the digital circuit of its own chip. Due to this, the power consumption of the chip can be reduced.

The solid-state imaging device 10 explained above can be applied as an imaging device to a digital camera or video camera, portable terminal, monitoring camera, camera for medical endoscope, or other electronic apparatus.

Figure 13:
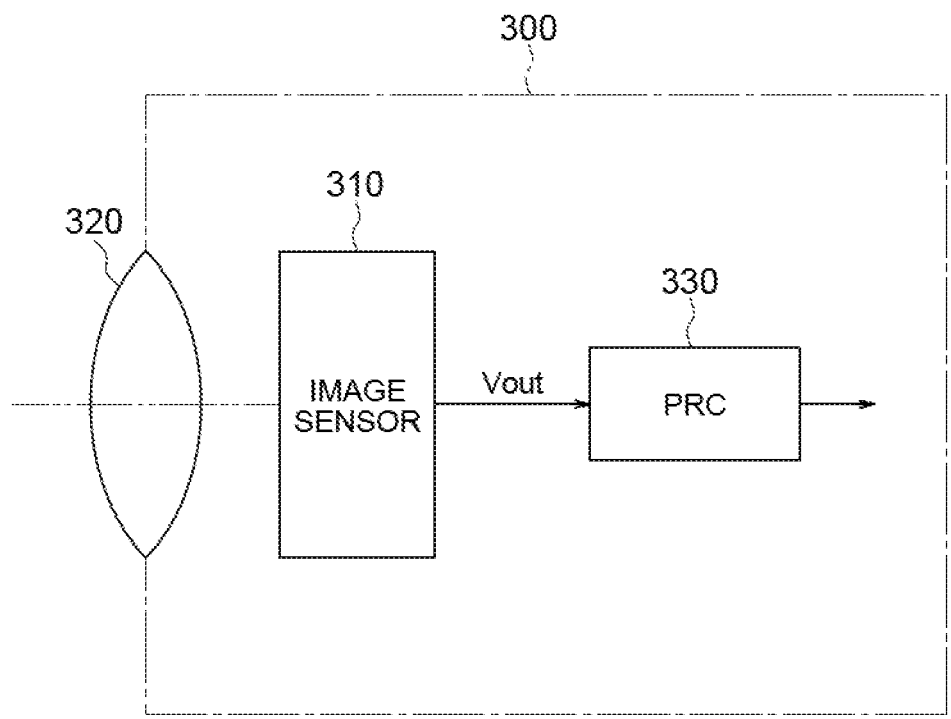
FIG. 13 is a view showing an example of the configuration of an electronic apparatus to which the solid-state imaging device according to an embodiment of the present invention is applied.

FIG. 13 is a view showing an example of the configuration of an electronic apparatus mounting a camera system to which the solid-state imaging device according to an embodiment of the present invention is applied.

The present electronic apparatus 300, as shown in FIG. 13, has a CMOS image sensor 310 to which the solid-state imaging device 10 according to the present embodiment can be applied. Further, the electronic apparatus 300 has an optical system (lens etc.) 320 for guiding incident light (forming a subject image) into the pixel region of this CMOS image sensor 310. The electronic apparatus 300 has a signal processing circuit (PRC) 330 for processing the output signal of the CMOS image sensor 310.

The signal processing circuit 330 applies predetermined signal processing to the output signal of the CMOS image sensor 310. The image signal processed in the signal processing circuit 330 can be projected as a moving picture on a monitor configured by a liquid crystal display or the like or can be output to a printer. Further, it may be directly recorded in a memory card or other storage media. Various aspects are possible.

As explained above, by mounting the solid-state imaging device 10 explained before as the CMOS image sensor 310, it becomes possible to provide a high performance, small-size, and low cost camera system. Further, electronic apparatuses used for applications with restrictions due to the requirements of installation of cameras such as mounting size, number of connectable cables, cable lengths, and installation heights such as monitoring cameras, cameras for medical endoscopes, etc. can be realized.

The invention claimed is:

1. A solid-state imaging device comprising:
a pixel portion which are arranged at least first pixels including photoelectric conversion reading parts and signal holding parts and second pixels including photoelectric conversion reading parts,
a readout portion for reading pixel signals from the pixel portion,
a first signal line to which readout signals of the photoelectric conversion reading parts are output, and
a second signal line to which held signals of the signal holding parts are output, wherein
a photoelectric conversion reading part of at least the first pixels includes
an output node,
a photoelectric conversion element which accumulates a charge generated by photoelectric conversion in an accumulation period,
a transfer element capable of transferring the charges accumulated in the photoelectric conversion element in a transfer period,
a floating diffusion to which the charge accumulated in the photoelectric conversion element is transferred through the transfer element,
a source follower element which converts the charge of the floating diffusion to a voltage signal corresponding to the charge amount and outputs the converted signal to the output node,
a reset element which resets the floating diffusion to a predetermined potential in a reset period, and
a selection element which electrically connects the output node with the first signal line in a first period, and
the signal holding part includes
a signal holding capacitor capable of holding a signal output from the output node of the photoelectric conversion reading part of the first pixels,
a switch element which selectively connects the signal holding capacitor with the output node of the photoelectric conversion reading part in a second period, and
an output part including a source follower element which outputs a signal held in the signal holding capacitor in accordance with a held voltage in the second period and selectively outputting the converted signal to the second signal line, and wherein the pixel portion includes at least
a first pixel array in which the plurality of photoelectric conversion reading parts of the first pixels are arranged in a matrix,
a second pixel array in which the plurality of photoelectric conversion reading parts of the second pixels are arranged in a matrix, and
a holding part array in which the plurality of signal holding parts of the first pixels are arranged in a matrix, and wherein the photoelectric conversion reading part of the second pixels includes
a photoelectric conversion element which accumulates a charge generated by photoelectric conversion in an accumulation period,
a transfer element capable of transferring the charge accumulated in the photoelectric conversion element in a transfer period,
a floating diffusion to which the charge accumulated in the photoelectric conversion element is transferred through the transfer element,
a source follower element which converts the charge in the floating diffusion to a voltage signal corresponding to a charge amount
a reset element which resets the floating diffusion to a predetermined potential in a reset period, and
a selection element which electrically connects the output line of the voltage signal from the source follower element with the first signal line in the first period.

2. The solid-state imaging device as set forth in claim 1, wherein the second pixel array is arranged at least at one side of the two sides of the first pixel array in the wiring direction of the first signal line.

3. The solid-state imaging device as set forth in claim 1, wherein the second pixel array is arranged at least at one side of the two sides of the first pixel array in the direction perpendicular to the wiring direction of the first signal line.

4. The solid-state imaging device as set forth in claim 1, wherein at the time of the first operation, the readout portion makes the first pixel array of the first pixels and the second pixel array of the second pixels active to read out the pixel signals.

5. The solid-state imaging device as set forth in claim 1, wherein, at the time of the second operation, the readout portion renders the selection elements in the photoelectric conversion reading parts of the first pixels and the second pixels the non-selection state then makes the first pixel array and the holding part array of the first pixels active to read out the pixel signals.

6. The solid-state imaging device as set forth in claim 1, wherein,
at the time of the first operation, the readout portion makes the first pixel array of the first pixels and the second pixel array of the second pixels active to read out the pixel signals and,
at the time of the second operation, renders the selection elements of the photoelectric conversion reading parts of the first pixels and the second pixels the non-selection state then makes the first pixel array and the holding part array of the first pixels active to read out the pixel signals.

7. The solid-state imaging device as set forth in claim 6, wherein:
at the time of the second operation, the readout portion can output an image having any aspect ratio which can be formed in the first pixel array and,
at the time of first operation, the readout portion can output an image having any aspect ratio which can be formed in a composite pixel array formed by the first pixel array and the second pixel array.

8. The solid-state imaging device as set forth in claim 1, wherein:
the pixel signal read out from the photoelectric conversion reading part of the first pixel includes at least a reset readout signal and readout signal, and
the signal holding part includes
a first holding node, a second holding node, a first signal holding capacitor which is connected to the first holding node and can hold the signal output from the output node of the photoelectric conversion reading part of the first pixel, a second signal holding capacitor which is connected to the second holding node and can hold the signal output from the output node of the photoelectric conversion reading part of the first pixel, a first switch element which selectively connects the first holding node to which the first signal holding capacitor is connected with the output node of the photoelectric conversion reading part in the second period, a second switch element which selectively connects the first holding node and the second holding node in the second period, and an output part including a source follower element which outputs, in the second period, the signal held in the second signal holding capacitor connected to at least the second holding node between the first holding node and the second holding node in accordance with the held voltage and selectively outputting the converted signal to the second signal line.

9. The solid-state imaging device as set forth in claim 8, wherein:

the readout portion reads out, as pixel signals, the reset readout signal from the photoelectric conversion reading part of the first pixel, then reads out the readout signal, when reading the reset readout signal as the pixel signal, makes the first switch element and the second switch element of the signal holding part conductive in a predetermined period to make the second signal holding capacitor hold the readout reset signal and renders the second switch element the non-conductive state, when reading the readout signal as the pixel signal, holds the second switch element of the signal holding part in the non-conductive state, makes the first switch element conductive to make the first signal holding capacitor hold the readout signal, and renders the first switch element the non-conductive state, in a state where the first switch element and the second switch element are held in the non-conductive state, outputs a conversion signal corresponding to the reset readout signal held in the second signal holding capacitor to the second signal line, and, in a state where the first switch element is held in the non-conductive state and the second switch element is held in the conductive state, outputs a conversion signal corresponding to a composite signal of the reset readout signal held in the second signal holding capacitor and the readout signal held in the first signal holding capacitor to the second signal line.

10. The solid-state imaging device as set forth in claim 1, wherein:

the device has a stacked structure which includes a first substrate and a second substrate, the first substrate and the second substrate connected through a connection part, the first substrate is formed with at least the photoelectric conversion reading parts of the first pixels and the first signal line, and the second substrate is formed with at least the signal holding parts of the first pixels, the second signal line, and at least a portion of the readout portion.

11. The solid-state imaging device as set forth in claim 1, wherein:

the device has a stacked structure which includes a first substrate and a second substrate, the first substrate and the second substrate connected through a connection part, the first substrate is formed with at least the first pixel array, the second pixel array, the first signal line, and a portion of the readout portion, and the second substrate is formed with at least the signal holding parts of the first pixels, the second signal line, and at least a portion of the readout portion.

12. The solid-state imaging device as set forth in claim 1, wherein the device includes a charge re-utilization part which transfers charges held in the signal holding capacitors of the plurality of signal holding parts of the first pixels to an external capacitor and reuses the same as the power supply of a digital circuit of its own chip.

13. The solid-state imaging device as set forth in claim 12, wherein the charge re-utilization part includes an external capacitor capable of accumulating the charges held in the signal holding capacitors of the plurality of signal holding parts of the first pixels and a power supply circuit part capable of supplying processing-use power generated by using the charges held in the external capacitor to a processing system circuit.

14. The solid-state imaging device as set forth in claim 13, wherein:

a pixel signal read out from the photoelectric conversion reading part of the first pixel at least includes a reset readout signal and readout signal, and the signal holding part includes a first holding node, a second holding node, a first signal holding capacitor which is connected to the first holding node and can hold the signal output from the output node of the photoelectric conversion reading part of the first pixel, a second signal holding capacitor which is connected to the second holding node and can hold the signal output from the output node of the photoelectric conversion reading part of the first pixel, a first switch element which selectively connects the first holding node to which the first signal holding capacitor is connected with the output node of the photoelectric conversion reading part in the second period, a second switch element which selectively connects the first holding node and the second holding node in the second period, an external connection switch element which connects the first holding node with the external capacitor in a charge recycle period, and an output part including a source follower element which outputs, in the second period, the signal held in the second signal holding capacitor connected to at least the second holding node between the first holding node and the second holding node in accordance with the held voltage and selectively outputting the converted signal to the second signal line.

15. The solid-state imaging device as set forth in claim 14, wherein:

the readout portion reads out, as pixel signals, the reset readout signal from the photoelectric conversion reading part of the first pixel, then reads out the readout signal, when reading the reset readout signal as the pixel signal, makes the first switch element and the second switch element of the signal holding part conductive in a predetermined period to make the second signal holding capacitor hold the readout reset signal and renders the second switch element and the first switch element the non-conductive state, renders the external connection switch element the conductive state for the predetermined period to transfer the charge in the first signal holding capacitor to the external capacitor and perform the first charge recycle, when reading the readout signal as the pixel signal, holds the second switch element of the signal holding part in the non-conductive state, makes the first switch element conductive to make the first signal holding capacitor hold the readout signal, and renders the first switch element the non-conductive state, in a state where the first switch element and the second switch element are held in the non-conductive state, outputs a conversion signal corresponding to the reset readout signal held in the second signal holding capacitor to the second signal line, in a state where the first switch element is held in the non-conductive state and the second switch element is held in the conductive state, outputs a conversion signal corresponding to a composite signal of the reset readout signal held in the second signal holding capacitor and the readout signal held in the first signal holding capacitor to the second signal line, and, in a state where the first switch element is held in the non-conductive state and the second switch element is held in the conductive state, makes the external connection switch element conductive in the predetermined period and transfers the charges in the first signal holding capacitor and the second signal holding capacitor to the external capacitor thereby performing the second charge recycle.

16. The solid-state imaging device as set forth in claim 15, wherein:

a signal holding part includes a third switch element which selectively connects the first holding node and a predetermined reference potential in the second period, and the readout portion, before reading the reset readout signal, holds the second switch element and the third switch element in the conductive state and removes residual charges of the first signal holding capacitor and the second signal holding capacitor, and, before reading the readout signal after the first charge recycle processing, holds the third switch element in the conductive state and removes the residual charge in the first signal holding capacitor.

17. A method for driving a solid-state imaging device having a pixel portion which are arranged first pixels including photoelectric conversion reading parts and signal holding parts and second pixels including photoelectric conversion reading parts, a readout portion for reading pixel signals from the pixel portion, a first signal line to which readout signals of the photoelectric conversion reading parts are output, and a second signal line to which held signals of the signal holding parts are output, wherein a photoelectric conversion reading part of at least the first pixels includes an output node, a photoelectric conversion element which accumulates a charge generated by photoelectric conversion in an accumulation period, a transfer element capable of transferring the charges accumulated in the photoelectric conversion element in a transfer period, a floating diffusion to which the charge accumulated in the photoelectric conversion element is transferred through the transfer element, a source follower element which converts the charge of the floating diffusion to a voltage signal corresponding to the charge amount and outputs the converted signal to the output node, a reset element which resets the floating diffusion to the predetermined potential in a reset period, and a selection element which electrically connects the output node with the first signal line in a first period, the signal holding part includes a signal holding capacitor capable of holding a signal output from the output node of the photoelectric conversion reading part of the first pixels, a switch element which selectively connects the signal holding capacitor with the output node of the photoelectric conversion reading part in a second period, and an output part including a source follower element which outputs a signal held in the signal holding capacitor in accordance with a held voltage in the second period and selectively outputting the converted signal to the second signal line, and the pixel portion includes a first pixel array in which the plurality of photoelectric conversion reading parts of the first pixels are arranged in a matrix, a holding part array in which the plurality of signal holding parts of the first pixels are arranged in a matrix, and a second pixel array in which the plurality of photoelectric conversion reading parts of the second pixels are arranged in a matrix, the method for driving a solid-state imaging device comprising making the first pixel array of the first pixels and the second pixel array of the second pixels active and reading the pixel signals at the time of a first operation and rendering the selection elements in the photoelectric conversion reading parts in the first pixels and in the second pixels non-selection states, then making the first pixel array of the first pixels and the holding part array active and reading the pixel signals at the time of a second operation.

18. An electronic apparatus comprising a solid-state imaging device and an optical system forming a subject image in the solid-state imaging device, wherein the solid-state imaging device has a pixel portion which are arranged at least first pixels including photoelectric conversion reading parts and signal holding parts and second pixels including photoelectric conversion reading parts, a readout portion for reading pixel signals from the pixel portion, a first signal line to which readout signals of the photoelectric conversion reading parts are output, and a second signal line to which held signals of the signal holding parts are output, a photoelectric conversion reading part of at least the first pixels includes
an output node,
a photoelectric conversion element which accumulates a charge generated by photoelectric conversion in an accumulation period,
a transfer element capable of transferring the charges accumulated in the photoelectric conversion element in a transfer period,
a floating diffusion to which the charge accumulated in the photoelectric conversion element is transferred through the transfer element,
a source follower element which converts the charge of the floating diffusion to a voltage signal corresponding to the charge amount and outputs the converted signal to the output node,
a reset element which resets the floating diffusion to the predetermined potential in a reset period, and
a selection element which electrically connects the output node with the first signal line in a first period, and
the signal holding part includes
a signal holding capacitor capable of holding a signal output from the output node of the photoelectric conversion reading part of the first pixels,
a switch element which selectively connects the signal holding capacitor with the output node of the photoelectric conversion reading part in a second period, and
an output part including a source follower element which outputs a signal held in the signal holding capacitor in accordance with a held voltage in the second period and selectively outputting the converted signal to the second signal line, and wherein
the pixel portion includes at least
a first pixel array in which the plurality of photoelectric conversion reading parts of the first pixels are arranged in a matrix,
a second pixel array in which the plurality of photoelectric conversion reading parts of the second pixels are arranged in a matrix, and
a holding part array in which the plurality of signal holding parts of the first pixels are arranged in a matrix, and wherein
the photoelectric conversion reading part of the second pixels includes
a photoelectric conversion element which accumulates a charge generated by photoelectric conversion in an accumulation period,
a transfer element capable of transferring the charge accumulated in the photoelectric conversion element in a transfer period,
a floating diffusion to which the charge accumulated in the photoelectric conversion element is transferred through the transfer element,
a source follower element which converts the charge in the floating diffusion to a voltage signal corresponding to a charge amount
a reset element which resets the floating diffusion to a predetermined potential in a reset period, and
a selection element which electrically connects the output line of the voltage signal from the source follower element with the first signal line in the first period.

* * * * *